United States Patent
Kleveland et al.

(10) Patent No.: US 9,037,928 B2
(45) Date of Patent: May 19, 2015

(54) MEMORY DEVICE WITH BACKGROUND BUILT-IN SELF-TESTING AND BACKGROUND BUILT-IN SELF-REPAIR

(71) Applicants: Bendik Kleveland, Santa Clara, CA (US); Dipak K Sikdar, Santa Clara, CA (US); Rajesh Chopra, San Ramon, CA (US); Jay Patel, Los Gatos, CA (US)

(72) Inventors: Bendik Kleveland, Santa Clara, CA (US); Dipak K Sikdar, Santa Clara, CA (US); Rajesh Chopra, San Ramon, CA (US); Jay Patel, Los Gatos, CA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/732,783

(22) Filed: Jan. 2, 2013

(65) Prior Publication Data

US 2013/0173970 A1    Jul. 4, 2013

Related U.S. Application Data

(60) Provisional application No. 61/582,365, filed on Jan. 1, 2012.

(51) Int. Cl.
| | |
|---|---|
| *G06F 11/20* | (2006.01) |
| *G11C 29/44* | (2006.01) |
| *G11C 29/16* | (2006.01) |
| *G06F 11/10* | (2006.01) |
| *G11C 29/12* | (2006.01) |
| *G11C 29/06* | (2006.01) |
| *G11C 29/04* | (2006.01) |

(52) U.S. Cl.
CPC ............ *G06F 11/2094* (2013.01); *G11C 29/44* (2013.01); *G11C 29/4401* (2013.01); *G11C 29/06* (2013.01); *G11C 29/16* (2013.01); *G11C 2029/0409* (2013.01); *G06F 11/106* (2013.01); *G11C 29/12* (2013.01)

(58) Field of Classification Search
CPC ............ G11C 2029/0409; G11C 2029/2602; G11C 29/44; G11C 29/4401; G11C 29/16; G11C 29/06; G06F 11/106

USPC .............. 714/710, 718, 6.1, 42; 711/113, 126
See application file for complete search history.

(56) References Cited

U.S. PATENT DOCUMENTS

| | | | |
|---|---|---|---|
| 6,182,257 B1 * | 1/2001 | Gillingham | ................... 714/733 |
| 6,681,358 B1 | 1/2004 | Karimi et al. | |
| 6,728,916 B2 | 4/2004 | Chen et al. | |
| 6,934,205 B1 | 8/2005 | Pandey et al. | |
| 6,987,684 B1 | 1/2006 | Branth et al. | |
| 7,304,875 B1 * | 12/2007 | Lien et al. | ..................... 365/49.1 |
| 7,360,130 B2 * | 4/2008 | Margolin | ..................... 714/718 |
| 7,877,657 B1 | 1/2011 | Miller et al. | |
| 8,028,211 B1 | 9/2011 | Miller et al. | |
| 2002/0178416 A1 | 11/2002 | Chen et al. | |

OTHER PUBLICATIONS

ISA/KR, International Search Report and Written Opinion for International Application No. PCT/US2013/020698, 14 pages.
Alfred Benso et al., "An On-Line BIST RAM Architecture With Self-Repair Capabilities," IEEE Transactions on Reliability, vol. 51, No. 1., Mar. 2002.
G. Theodorou, et al., "A Software-Based Self-Test Methodology for On-Line Testing of Processor Caches," IEEE International Test Conference, 2011.

* cited by examiner

*Primary Examiner* — John P Trimmings
(74) *Attorney, Agent, or Firm* — MoSys, Inc. (crn)

(57) ABSTRACT

A memory device with background built-in self-testing (BBIST) includes a plurality of memory blocks; a memory buffer to offload data from one of the plurality of memory blocks temporarily; and a memory block stress controller to control a stress test applied to the one of the memory blocks when the data is temporarily offloaded on the memory buffer. The stress test tests for errors in the one of the plurality of the memory blocks.

76 Claims, 18 Drawing Sheets

FIG. 6A
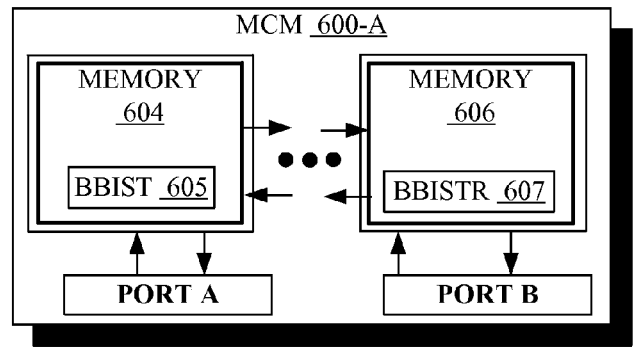
FIG. 6B
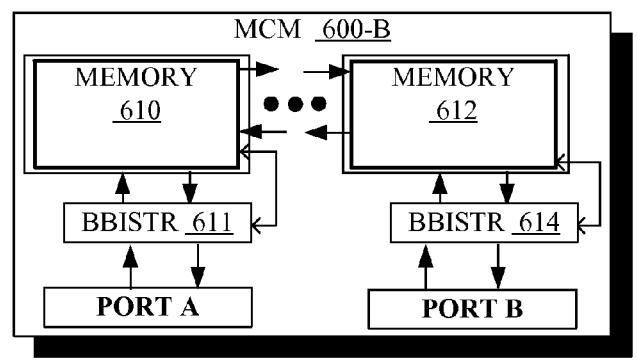
FIG. 6C
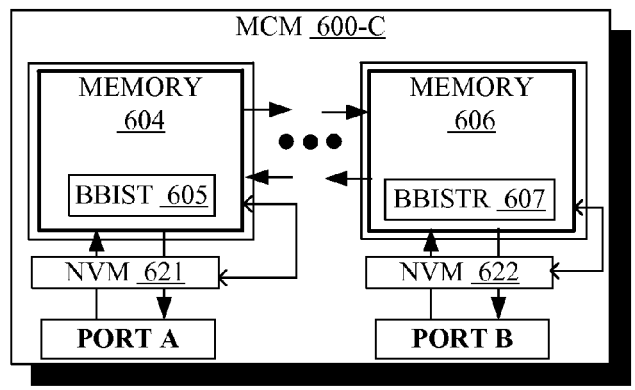
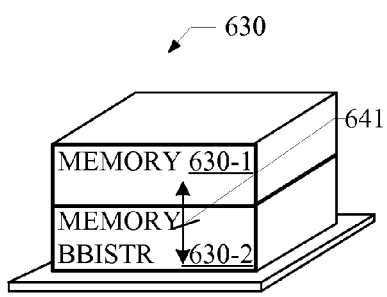
FIG. 6D
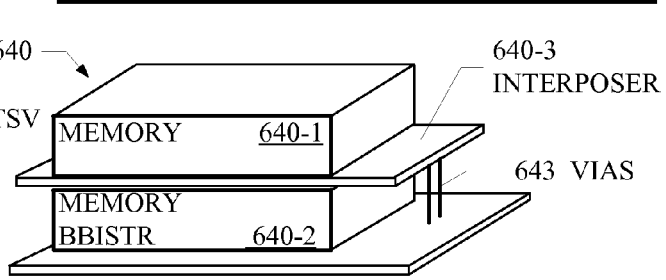
FIG. 6E

SCRUBBED ADDRESS, REPEAT ALGORITHM TO DIAGNOSE SINGLE ERROR UPSET VS WEAK BIT

MEMORY DEVICE WITH BACKGROUND BUILT-IN SELF-TESTING AND BACKGROUND BUILT-IN SELF-REPAIR

CROSS-REFERENCE TO RELATED APPLICATIONS

This application claims priority to and benefit of U.S. provisional Patent Application No. 61/582,365, filed on Jan. 1, 2012, entitled "Hidden Memory Repair," by Bendik Kleveland, which application(s) are also incorporated by reference herein in its entirety.

BACKGROUND

Referring to Prior Art FIG. 1, a functional block diagram of a prior art memory that uses scrubbing to correct detected errors, is shown. Scrubbing is a method of using extra bits of information, that is, redundant information, added to the data itself to identify whether the data has any errors and to provide the opportunity to correct it with a background task that periodically inspects memory for errors, and then corrects the error using a copy of the data. It reduces the likelihood that single correctable errors will accumulate; thus, reducing the risk of uncorrectable errors. Examples of redundant information include parity bits and error correction code (ECC) bits associated with that data. Hamming codes are popular ECC codes that can be used to detect and correct a single-error (single error correction, SEC) in a word, and perform double error detection (DET). Such a code cannot perform double error correction, as there is insufficient information in the ECC to locate exactly which bits have the error. For example, a Hamming (7, 4) code encodes 4 data bits into 7 total bits, e.g., with 3 bits of parity for a SECDEC ECC. Scrubbing utilizes the ECC for SEC. A memory can be checked for errors by reading the data with the parity bits and operating the ECC algorithm to detect and correct a single-bit error. The corrected data, along with the parity bits, can then be written back into memory as corrected data, thus scrubbing out the original data error.

Scrubbing is useful for checking memory for single bit errors, but it is not effective at correcting more than a single bit of the data associated with it. Single bit errors might arise because of a weak memory cell, e.g., leaky gates, or due to a single upset event, e.g., a random alpha particle hit (APH) causing a soft error by flipping a bit. Scrubbing is helpful at resetting these random flipped bits, due to random soft errors. A weak memory cell, however, while possibly intermittent, will return faulty data repeatedly. Even though ECC could correct for a single weak memory cell, there is a risk that a random soft error could appear in a word that also has a weak memory cell before the scrubbing corrects either one of the errors. This could result in two or more bit errors occurring for a data string associated with the ECC resulting in an unrecoverable error. At that point, the errors for that given portion of data will not be correctable, and a frame or packet may be dropped, or an interrupt or resend request may be needed, or in the worst case, the system may crash. Examples of double-bit errors include one weak cell in the same portion of memory as another memory cell suffering an APH, or in the same portion of memory as a newly arising second weak cell.

In such a circumstance, memory can be tested by taking the chip off line and performing a test, causing a system interrupt and down time. A chip may pass test but be deemed of insufficient reliability to continue service. It may otherwise be judged unserviceable, due to the unpredictability of its performance, the perceived future degradation threat against needed system reliability and up time, or simply because of a lack of redundant memory resources (RMR), by prior consumption of the RMR or insufficient capability of the RMR.

SUMMARY

A system, method, and apparatus for background built-in self-test (BBIST) are presented. Additionally, a system, method and apparatus for background built-in self-diagnosis (BBISD) using the results of the BBIST are presented. Furthermore, a system, method, and apparatus for background built-in self-repair (BBISR) are also presented to fix the problems and failures discovered in the BBIST and BBISD. These different embodiments, referred to as resilient memory, can be utilized separately or together. Together these three capabilities, when grouped together, are referred to as built-in self-test/diagnostics/repair (BBISTDR), or "BBIST-DR" or "BBIST-doctor" suite, are extremely effective for providing standalone and self-sufficient, non-interrupting, high reliability and long lifetime memory.

The built-in self test/diagnosis/repair/scrubbing is self-monitored and self-managed to operate transparently in the background in real-time and parallely to normal data operation of the memory without any performance degradation or system interrupts. Such operation continues while testing for both failed memory components that do not meet their specification, and for weak memory components that are stress tested using margined parameters beyond specification requirements, e.g., stress-tested. The purpose is to identify, diagnose, and replace failed or weak components in a preventative maintenance (PM) fashion very early, before an estimated, predicted, or actual failure. The margined parameters are implemented on the localized circuit under test (CUT) portion of the entire chip or module, while the adjacent and surrounding memory is concurrently, independently, and reliably operated within specification parameters without adding latency. Beyond the cumulative benefits of BBIST-DR functionality, scrubbing the memory using ECC is also optionally used in conjunction with the BBIST-DR suite to identify single event upsets, such as the alpha particle hit. Because even memory that is failure-free and culled from weak cells can be subject to an alpha particle hit. The resultant benefits of the present apparatus, system and method include: multiplied reliability, extended life, improved yield, reduced down-time, more accurate predictive analysis and long-lead time PM, reduced cost, improved service, etc. for the memory itself, whether standalone, module or integrated in larger chip, e.g., a system on a chip (SOC), as well as for the subsequent assemblies of a line card, chassis, server, and communication infrastructure.

The present disclosure is applicable to any type of memory regardless of form factor, with examples including: standalone, commodity, smart, intelligent RAM, embedded, cached, stacked, module-based, etc. types of memory and regardless of construction-type, such as: dynamic random access memory (DRAM), static RAM (SRAM), embedded DRAM (eDRAM or 1T-SRAM), magnetic memory (MRAM), non-volatile memory (NVM) such as Flash, phase change memory (PRAM), one-time programmable memory (OTP) etc. The present disclosure is also applicable to other data storage devices such as interface latches, registers, flip-flops, etc. whether located in the core of a chip or in some circumstances located at an interface that can be stress tested, diagnosed, and repaired in conjunction with the joint testing action group (JTAG) protocol.

The first portion of the system, the BBIST, can be used as a standalone apparatus/method or can be managed by a host.

As a standalone unit, the test results can be stored internally until a non-operational failure is more certain or imminent. Alternatively, the results can be communicated to a host or offline preventative maintenance (PM) manager. The BBIST can also be used in combination with the BBISD to provide an evaluation of the test results. Finally, the BBIST can be used together with the BBISD and the BBISR to provide the full suite of repair mechanisms.

Importantly, one or more of the test, diagnosis, and repair functions are programmable in any combination in one embodiment, for subsequent production or in-field updating of procedures, algorithms, thresholds, reporting protocols, etc. The result is a "programmable" built-in self-test (P-BBIST), programmable built-in-self-diagnosis (P-BBISD) and/or programmable built-in-self-repair (P-BBISR). Together, the programmable suite of functions is termed P-BBIST-DR, or "P-BBIST doctor."

As the name implies, the three options of test, diagnosis and repair (TDR) are configurable to be engaged in-situ, e.g., in the background of normal data operations. That is, the TDR operations are transparent and indecipherable to the host during operation, unless the host desires the results and status. In operation, a host on a line card that is operating a memory implementing the present description may be unaware that a problem ever existed in the memory, as the timing, quantity, and quality of the data provided appears unchanged, even as a test, a diagnosis, and/or a repair might be in progress. The host also has the option to monitor the status of the background repair operation continuously. Given this capability, the TDR system prevents an unwelcome surprise of a massive or catastrophic failure of a part in the field. Rather, the present invention provides a very early prediction of field-replacement, with predictive algorithms accounting for the rate of failure (whether linear or geometric), heuristics, and resource management, thereby allowing a reliable and cost-effective scheduled PM replacement.

The BBIST is provided by an apparatus having a cache memory, adjustable device parameter settings, and the logic to implement the procedure and algorithms. The cache memory is a temporary home for data from the portion of main memory (MM) slated for test, e.g., the CUT that is also referred to as the "target" memory under test (TMUT). The adjustable parameter settings can be any category desired such as time, voltage, temperature, etc. using adjustable hardware such as adjustable PLLs, DLLs, multi-voltage level sources, variable charge pumps, and using sensors. They are used to adjust or to select from and/or are used to sense the margin on performance operations involved in access such as refresh period, driving voltage and time, sense voltage and times, slew rates, cycle rates and times, and operating temperature. The adjustable equipment parameter settings are applied to any granularity-basis desired, e.g., bit, word, multi-words, word-line, etc. per the architecture that allows their selectivity on that basis. For example, word-size portions of memory cells can have a configurable or selectable, via muxing or via gated enabling or flag bit(s), driving voltage setting that stresses or margin-tests just the word portion of memory cells slated for test.

The logic for the procedure and algorithms for any portion of P-BBIST-DR can be either a finite state machine (FSM) implemented as custom or RTL logic, or a controller-/processor-implementation using firmware or software-based instructions. In operation, data accessed around the TMUT operates using specification settings of time and voltage, etc., while the selectable marginal settings of time and voltage are marginalized for the TMUT. Access to the data normally in the TMUT is provided by a very robust cache memory to reduce the possibility that the test itself is susceptible to any errors. The BBISD is provided by an apparatus having threshold levels and logic to implement the procedure and algorithms and decision points for performing a diagnosis. The BBISD receives the test data results from the BBIST. Using logic and parameter settings based on heuristics, statistics, linear quadratic estimations (LQE) such as Kalman filtering, and various other filtering techniques for predictions, along with an inventory of available repair resources, the BBISD makes a diagnosis and provides repair instruction to the BBISR. The BBISD also considers patterns of failures, such as proximity, temporal, causation, and other correlatable variables. The diagnostic apparatus has memory to store these patterns and results.

The BBISR includes one or more repair resources on the chip, including traditional redundant memory (RM), e.g., having the same construction as the main memory, and optionally including one other form of replacement memory resource, e.g., a hierarchical or shared memory (SM) resource of a desired granularity of the same or different construction type. In one embodiment, the MM is a matrix of memory cells arranged in rows (R) and columns (C) to form an R*C size of memory. Likewise the RM is an array or matrix of one or more redundant memory rows (RMR) by one or more redundant memory columns (RMC) that provide a redundant memory size of RMR*RMC. Finally, the SM is an array/matrix of memory having a size of redundant shared rows (RSR) times redundant shared columns (RSC) having a size of redundant shared memory size of RSR*RSC forms The background operations used for BBIST, BBISD, and/or BBISR are opportunistic, in that they wait for a slot, e.g., an open cycle, where one or more operations can be performed such as: copying, setting flags, adjusting counters, operating tests, diagnosing results, updating address tables and pointers, reloading data, enabling replacement memory, and activating same. To make the background TDR operations transparent to the host, a TMUT, such as a word line, is moved one portion at a time, e.g., one word at a time, during free cycles in a repeated process. Thus, portions of the TMUT may be split between its home in main memory or redundant memory, and between the temporary cache for housing the data while the physical main memory and redundant memory are later tested. Logic tracks the progress and the locations of individual portions of the TMUT such that an external access can be directed to the correct location of the actual data desired. By performing the TDR operations in parallel with typical memory operations not associated with TDR, the latency associated with TDR can be reduced or eliminated.

BRIEF DESCRIPTION OF THE DRAWINGS

Example embodiments are illustrated by way of illustrations and are not limited by the figures of the accompanying drawings, wherein:

FIG. 6A is a block diagram of a side-by-side (SBS) multi-chip-module (MCM) with one chip having BBIST and the other chip having BBISTR, according to one or more embodiments.

FIG. 6B is a block diagram of a SBS MCM with standalone chip BBISTR and with legacy memory chips not having BBIST, BBISD, BBISR, according to one or more embodiments.

FIG. 6C is a block diagram of an MCM having standalone chip redundant memory resources and having memory chips with BBIST or BBISTR, according to one or more embodiments.

FIG. 6D is a block diagram of a hybrid stacked MCM having multiple chips having through-silicon vias (TSVs) therebetween, with at least one of the chips having BBIST, according to one or more embodiments.

FIG. 6E is a block diagram of a hybrid stacked package on package (POP) MCM with an interposer, according to one or more embodiments.

Figure 1:
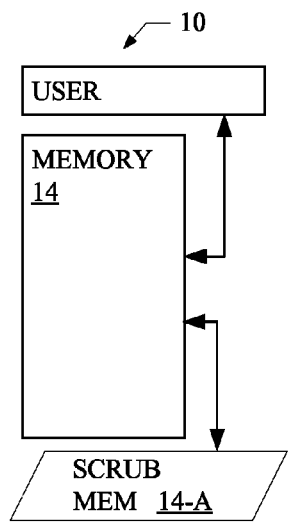
FIG. 1 is a functional block diagram of a prior art memory that uses scrubbing to correct detected errors.

The drawings referred to in this description should be understood as not being drawn to scale, except if specifically noted, in order to show more clearly the details of the present disclosure. Same reference numbers in the drawings indicate like elements throughout the several views. Other features and advantages of the present disclosure will be apparent by reference to the detailed description when considered in conjunction with the figures.

DETAILED DESCRIPTION

Reference will now be made in detail to embodiments of the present technology, examples of which are illustrated in the accompanying drawings. While the technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present technology. However, the present technology may be practiced without these specific details. In other instances, well known methods, procedures, components, and circuits have not been described in detail so as not to obscure aspects of the present embodiments.

Architecture Combinations

FIGS. 2A-2D illustrate various exemplary combinations of background test, diagnostic, and repair blocks, with optional programmability, hierarchical shared memory resource, and scrubbing function in a semiconductor chip. FIGS. 2A-2D all consist of a common baseline of an integrated circuit, (IC) 200-A through 200-D, having a main memory (MM) block 204 and an optional redundant memory (RM) block 205 coupled to each other. Data lines of interest are shown as solid arrowheads, while command and instructions lines of interest are shown by line arrowheads.

The RM 205 is a block of extra memory cells configurable to replace failed memory cells in MM 204 in any granularity desired, e.g., words, pages, wordlines, columns, or blocks, and at any time, e.g., either in production test and burn-in, or later in field operations as off-line built-in self-test (BIST), or as on-line background BIST (BBIST). RM 205 is typically the same memory cell construction as MM 204, e.g., DRAM, SRAM, eDRAM, etc., but can be of different memory cell construction in another embodiment. The granularity of RM 205 can be architected to any size as desired for overhead and reliability tradeoffs, with one embodiment of RM 205 having granularity of 1 column width and half of a memory module MEMMOD depth, e.g., 72 bits wide/word and 32 wordlines deep, for a total of 2304 bits.

An arbitrator block 300 is coupled to MM 204, RM 205, and to temporary memory (TM) 214 in order to route external accesses to the correct physical memory location of MM 204, RM 205, or TM 214. Arbitrator block 300 includes comparators, logic and memory for lookup tables, or maps to implement the flowchart operations for an access that are described in FIG. 9C. Arbitrator 300 is also further illustrated in subsequent FIG. 3.

Figure 4:
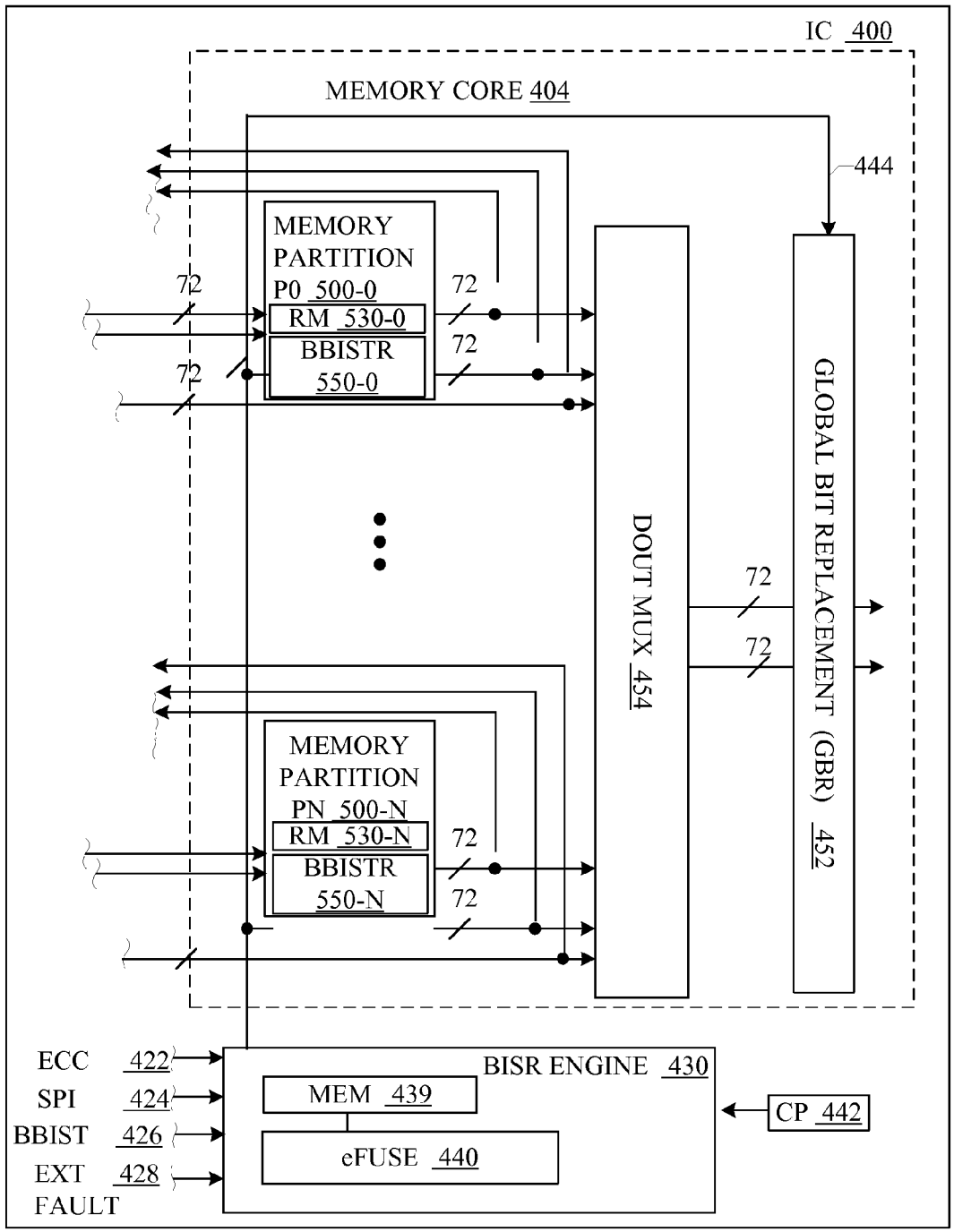
FIG. 4 is a block diagram of distributed BBIST on a multi-partitioned memory chip, according to one or more embodiments.

BBIST modules (BBISTM) 350-A, 350-B and P-BBISTM 351-A, 351-B are shown as a centralized single test block for MM 204 and RM 205 in the present embodiment, though it is well suited to a distributed architecture, as illustrated in subsequent FIGS. 4 and 5. BBISTM 350-A, 350-B and P-BBISTM 351-A, 351-B are coupled to ARB 300, to a memory access controller (MAC) in MM 204 and to RM 205 in order to perform the multiple test functions described in subsequent flowchart FIGS. 10A-B, such as: determining when a slot, or free-cycle exists to perform a discrete portion of the test algorithm, to retrieve the target memory under test (TMUT) from either the MM 204 or RM 205, and to perform tests on the physical memory in MM 204 or RM 205.

The TM 214 is of the same memory cell construction and size as MM 204 in one embodiment, while another embodiment utilizes a different, more robust memory cell size or construction, in order to be immune from single-event upsets such as an APH. That is, a robust TM 214 is of the same construction as MM 204 but larger, e.g., both MM 204 and TM 214 are eDRAM but the TM 214 has an larger capacitor, providing more charge to hold a logic level and therefore more resistance to an APH or other perturbations. Alternatively, a robust TM 214 is an SRAM like MM 204 but with thicker gate oxides and wider channels. In yet another embodiment, TM 214 is of a different memory cell construction or type that is more robust or much more robust than MM 204 in order to be immune from single-event upsets such as APH, e.g., the MM 204 is eDRAM, DRAM, or SRAM, while the TM 214 is a flip-flop, register, or a latch. The TM 214 can justify the tradeoff of robustness for size because of its higher-reliability requirements and its much fewer memory cells, depending upon the granularity size of memory being tested. In one embodiment, the portion of target memory under test (TMUT) in each block of each partition of MM 204 is a single wordline having 16 columns, or words, wherein each word has 72 bits, thereby resulting in a TMUT of 1152 memory cells storing the same quantity of bits. In comparison, the bank portion of MM 204, from which a given TMUT is tested, has 32 memory modules (MEMMOD), with each MEMMOD having 64 wordlines, with each wordline having 16 words, and with each word having 72 bits, for 2.359 Mbits worth of memory cells. In other words, the overhead required due to TM 214 is about 1/64th*1/32nd of the MM 204, or about 0.5 percent. Consequently, die area is not significantly impacted by having a memory cell in the TM 214 that is double or even an order of magnitude larger than a memory cell of the MM 204 which magnitude is dictated by empirical data to provide robustness.

Latency impact on an external access caused by TDR background components, whether background BBIST, BBISD, and/or BBIST, is configurable to be minimized or eliminated by coupling and operating the background components in parallel, e.g., in the background, with existing data accesses and related operations, e.g., a redundant memory lookup, wordline pre-charge, etc. Thus, background components operate transparently to the user. In another embodiment, any portion of the background component can operate with a partial latency increase or a full latency increase by operating the background component partially or fully in series with an existing data access operation. Operations associated only with background test and repairs are performed opportunistically, that is, when an open cycle, or slot, is available so as not to create a busy state when an external access is received. It could also be architected such that the internal access rate is higher than what is specified for the user, thus guaranteeing that the background BIST will have cycles to test and repair without any degradation in the user bandwidth.

The ICs 200-A through 200-D can comprise any application that uses memory such as: microprocessor, microcontroller, etc. with embedded memory; reconfigurable devices such as field programmable logic devices (FPGA), programmable logic devices (PLDs), etc. with embedded memory; memory caches such as L1 or L2 cache. Alternatively, the ICs 200-A through 200-D can be custom memory chips using commodity MM 204 and RM 20; "resilient memory" with on-board operations such as statistics, read-modify-write (RMW), content addressable memory (CAM), etc.; or other specialty memory chips. The ICs 200-A through 200-D can also be used in any combination with each other in a module, as they can operate independently of each other, as illustrated in subsequent FIGS. 6A-6E.

Non-programmable TDR background components, such as BBIST 350, BBISD 360, and/or BBISR 370 have a default instruction and thresholds programmed therein. In comparison, programmable TDR components, such as P-BBIST 351, P-BBISD 361, and/or P-BBISR 371, include memory storage, such as registers or NVM, for programmable instructions, threshold settings, and/or results. They may also include an external communication link via a dedicated instruction line, or via a control packet of a frame, or by a dedicated port such as a serial peripheral interface (SPI).

Figure 10A:
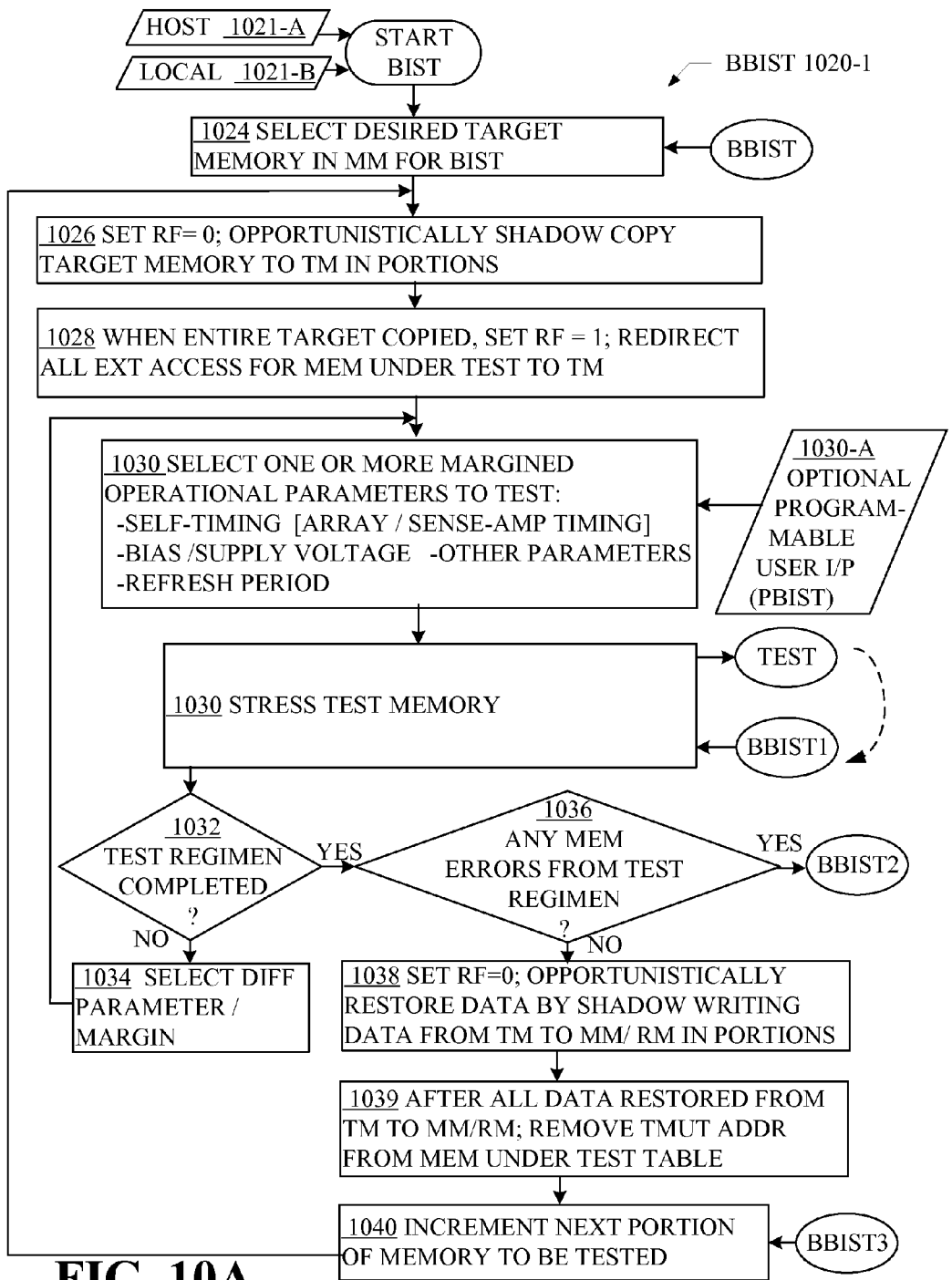
FIGS. 10A and 10B are flowcharts illustrating management operations of BBIST on memory, according to one or more embodiments.
Figure 10B:
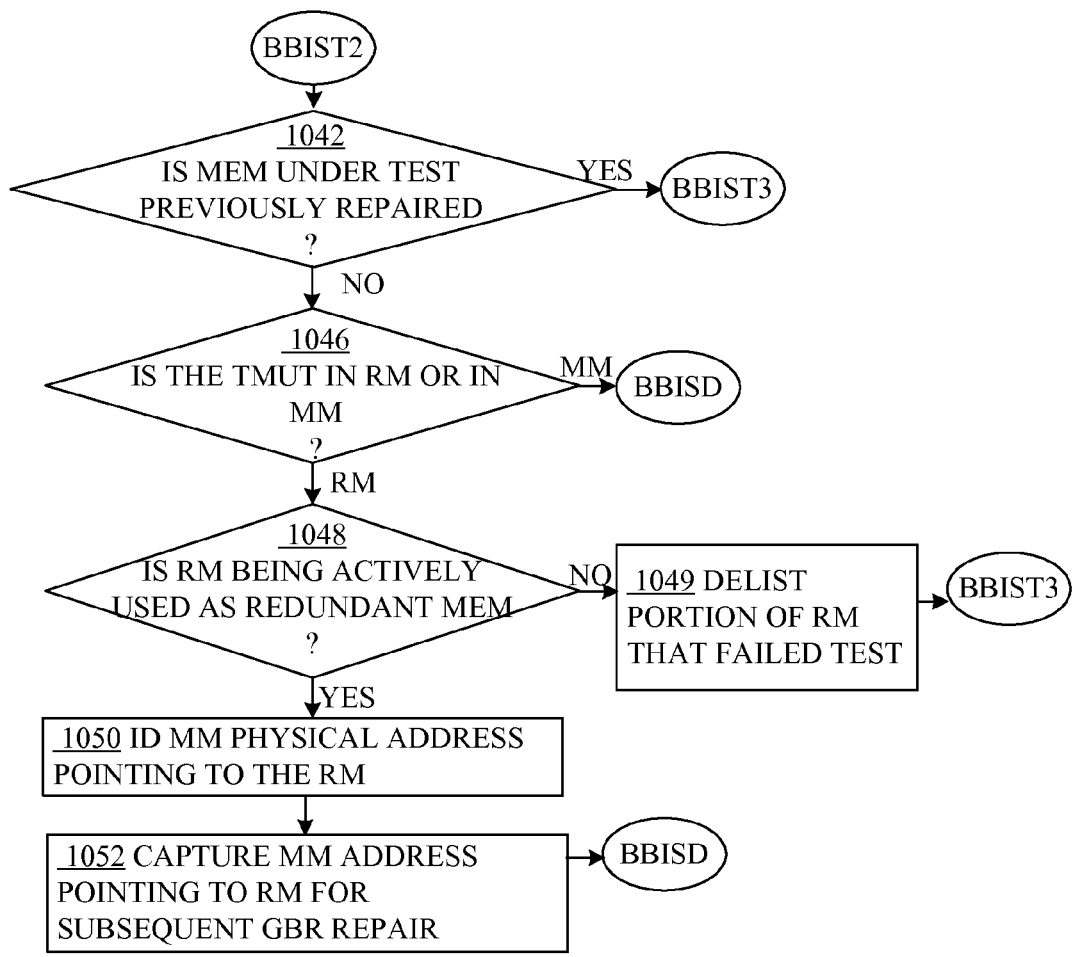
Figure 10C:
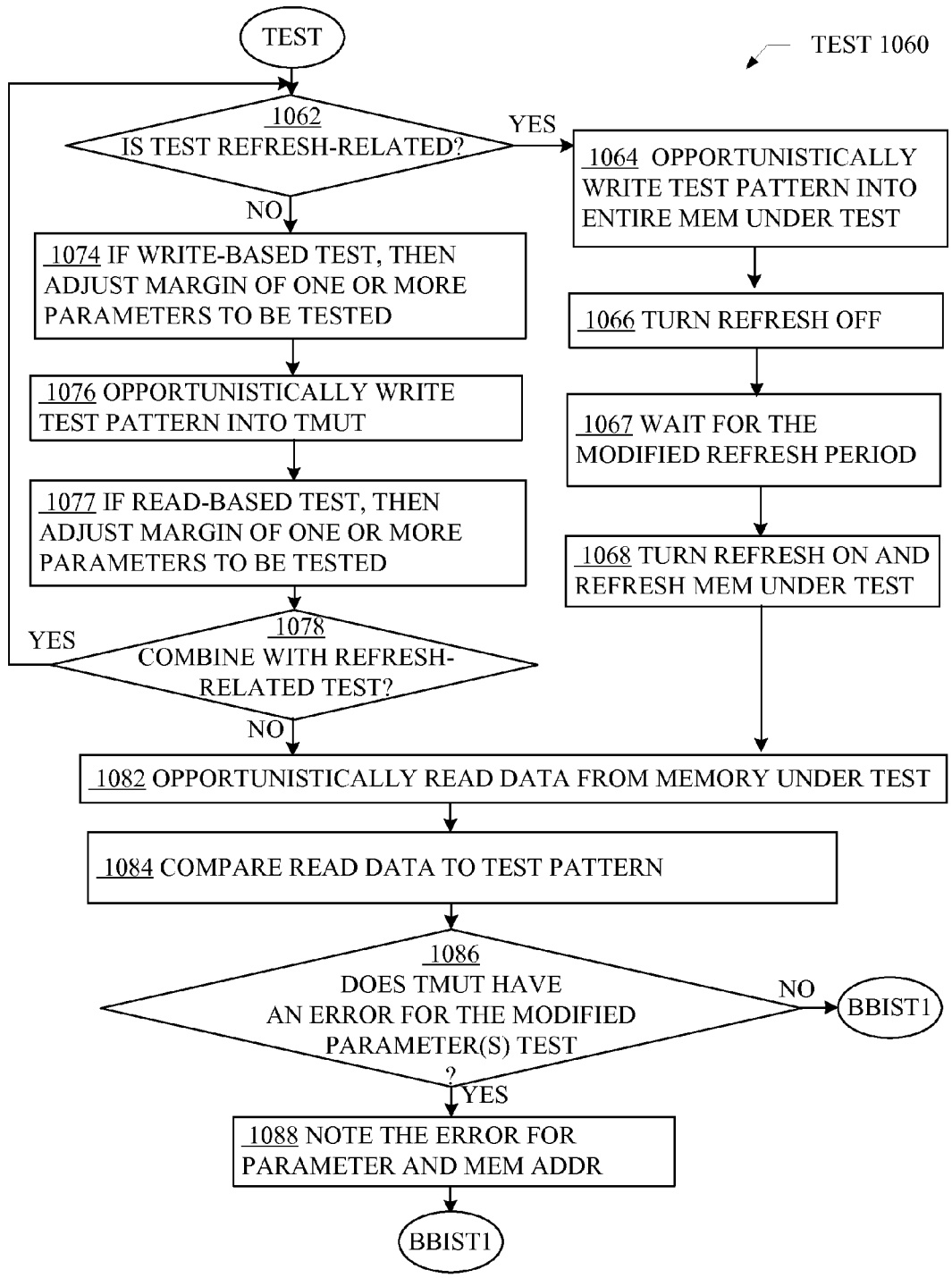
FIG. 10C is a flowchart illustrating the operation of the test portion of BBIST on memory, according to one or more embodiments.

All BBISTM 350-A, 350-B and P-BBISTM 351-A, 351-B have logic, either custom or RTL, and optional registers that implement the flowchart operations of BBIST described in FIGS. 10A-10C. Differences between FIGS. 2A through 2D are described hereinafter.

Figure 2A:
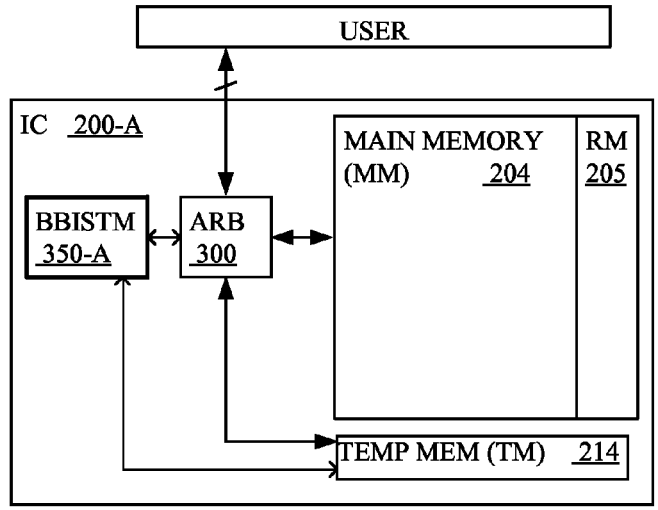
FIG. 2A is a block diagram of an integrated circuit having background built-in self test (BBIST), according to one or more embodiments.

Referring now to FIG. 2A, a block diagram of an integrated circuit having a baseline BBISTM 350-A is shown, according to one or more embodiments. The baseline BBISTM 350-A includes an FSM of custom logic or RTL that performs the sequence of operations to interface with the MM 204, including its built-in memory access controller (MAC), described in subsequent FIGS. 3B-3E and FIG. 5. The baseline BBISTM 350-A does not include a diagnostics block, BBISD, or a repair block, BBISR, and thus operates as either: an identifier of addresses with failures or weaknesses that require fixing, or as an early warning PM mechanism to the user, when a threshold, e.g., quantity of pending weaknesses will result in unrecoverable data, e.g., two-bit failures for a given portion of memory protected by ECC. By reporting failed/failing addresses to a user/host, the user/host can have a smaller population of addresses to check for corrections, e.g., rather than using EDC for every portion of data for from the memory, the user/host need only use EDC for the identified portions of data with a weak or failed memory cell per the memory BBIST, thereby saving power and reducing operations per second (OPS) at the host. Reporting to the host (user) is accomplished via an interrupt or via an embedded CMD on data line/bus, or a separate control line (not shown). The BBISTM 305-A is optionally configurable to record the failures, in terms of quantity and/or address location, in on-chip NVM for subsequent post-mortem analysis, e.g., where registers in BBISTM shown in subsequent figures are non-volatile.

Figure 2B:
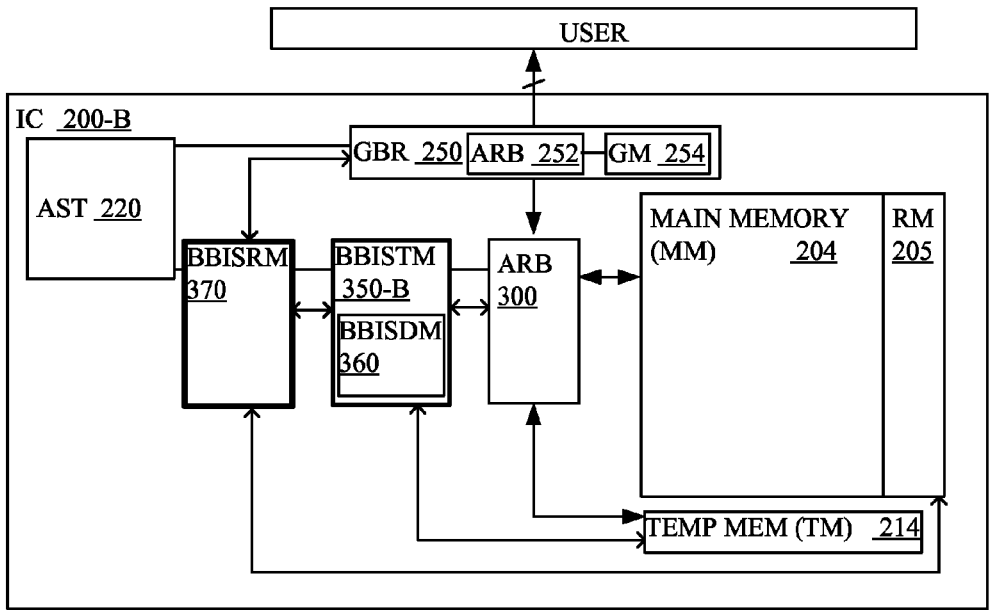
FIG. 2B is a block diagram of an integrated circuit having BBIST with integrated background built in self diagnostics (BBISD) and having a background built in self repair (BBISR), according to one or more embodiments.

Referring now to FIG. 2B, a block diagram of an integrated circuit having BBIST with integrated background built in self-diagnostics (BBISD) and background built in self-repair (BBISR) is shown, according to one or more embodiments. The BBISTM 350-B incorporates an embedded BBISD 360 therein and is coupled to BBISRM 370. The BBISDM 360 includes additional logic and optional registers to implement the additional flowchart operations of BBISD as described in FIG. 10C. The diagnostics feature provides intelligent analysis of the test results from weak and failed memory cells from BBISTM 350-B. For example, the rationing of redundant memory resources can be based on failed/weak cells data such as: quality, quantity, severity, proximity, grouping, temporality, degradation rates, etc., of weaknesses or failures and interaction between those factors. The result is more accurate diagnostics, predictions, repairs, and ultimately, a longer lifespan of the IC, e.g. the memory. The BBISD 360 accomplishes the operations of flowchart in FIG. 10C using hard-coded logic for a low-latency embodiment to look for patterns as described in subsequent FIG. 3D, though the present disclosure can be implemented using microcontroller-based code as well.

In addition FIG. 2B includes a hierarchical global shared memory resource, referred to as global bit redundancy (GBR) 250, which is coupled to BBISRM 370, to ARB 300, and to optional global address storage table (AST) 220. In brief, GBR 250 includes an arbitrator 252 and a global memory resource, or GBR memory (GM), 254. The GM 254 is a single bit resolution repair in the present embodiment, but can be of larger resolution in other embodiments, e.g., multiple bits, a word, etc. The quantity of stored bits and addresses in GMR 254 can be tailored to the application for expected quantity of failures over its lifetime. The BBISRM 370 is coupled to GBR 250 to indicate which failed/weak memory cells are to be replaced in the outgoing data traffic by storing and accessing their addresses in the AST 220. That is, for an external access, after MM 204 is read, and any pointers to TM 214 or RM 205 substitute in virtual memory values arising from production or in-field repairs, a final screening of the output data stream by GBR 250 can individually match addresses with faulty bits and substitute in an accurate data bit. This GBR repair can save an otherwise fully-functional IC that has a one or more single bit errors that renders it unreliable, e.g., for an IC that doesn't have bandwidth for off-line testing in the field or that has consumed all its RM resources slated to a given memory bank. The hierarchy of memory repair is first the RM 205 replacing faulty MM 204 memory cells on a block basis, and secondly the GBR 250 replacing faulty MM 204 or faulty RM 205 a bit-basis using GM 254. More detail is provided in subsequent FIG. 4, and in co-pending U.S. provisional Patent Application No. 61/702,253, filed on Sep. 18, 2012, entitled "Shared Memory Redundancy," by Dipak Sikdar et al., which application(s) are also incorporated by reference herein in its entirety.

Figure 2C:
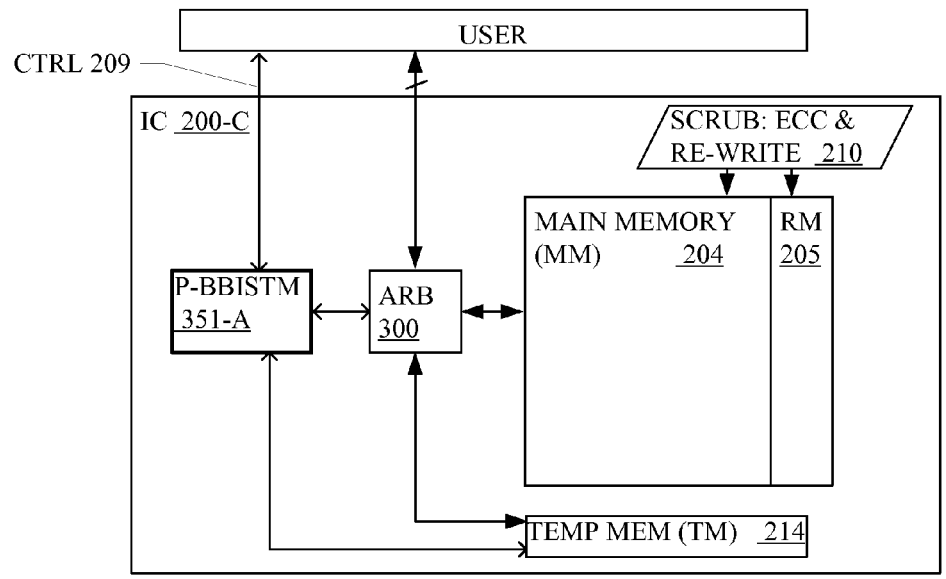
FIG. 2C is a block diagram of an integrated circuit having a BBIST that is programmable, and having a scrub operation according to one or more embodiments.

Referring now to FIG. 2C, a block diagram of an integrated circuit having a BBIST that is programmable and having an optional scrub operation is shown, according to one or more embodiments. The P-BBIST block, or module, (P-BBISTM) 351-A is coupled to the arbitrator 300 and the TM 214 similar to FIG. 2A. An optional control line (CTRL) 209 coupled between the user and the P-BBISTM 351-A allows the opportunistic communication of program instruction, thresholds, parameters, etc. from user to IC 200-C or have user initiate a BBIST, BBISD, and/or BBISR, e.g., if user notices a rash of bad data and wants to investigate the memory. The programmable aspect of P-BBISTM 351-A allows a flexible and on the fly, or real-time, adjustment without an interrupt of the tests being performed on MM 204 and RM 205 in order to adapt to changing field conditions or needs from the user.

Figure 2D:
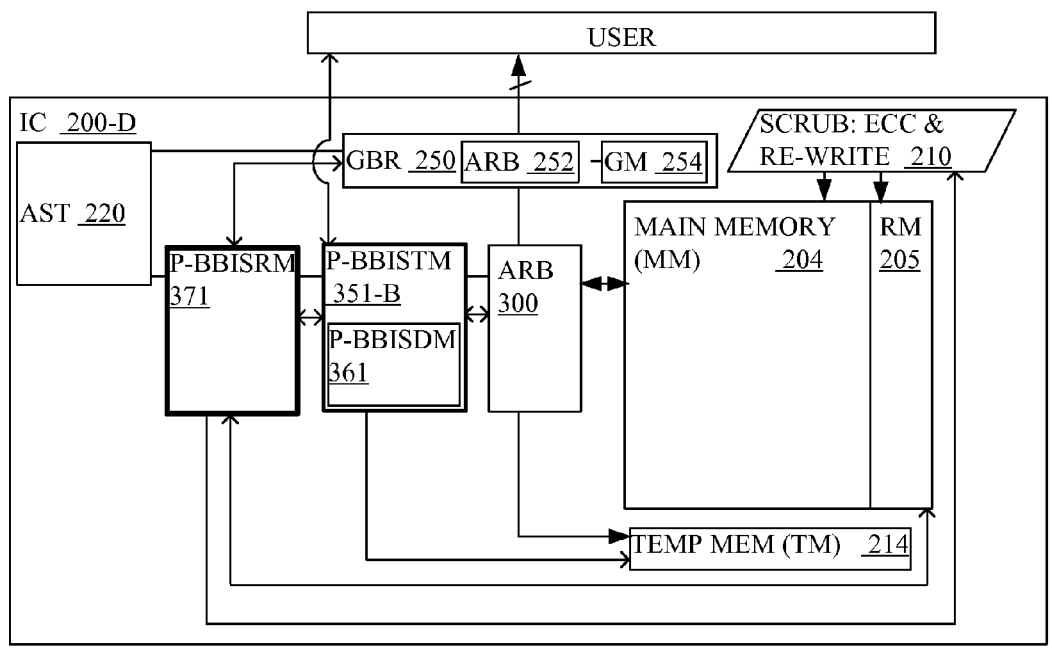
FIG. 2D is a block diagram of an integrated circuit having a superset of features including BBIST, BBISD, BBISR, programmability and a scrubbing operation, according to one or more embodiments.

The scrub operation in FIGS. 2C and 2D is an operation of retrieving a portion of memory that is opportunistically read and then processed through an error detection and correction (EDC) algorithm, and compared to the originally stored data to identify and replace any faulty bits. The scrub operation is typically performed to identify any single-event upsets such as an APH. The scrub operation is included in the present disclosure as an optional hierarchical layer of error detection and/or correction beyond that provided by the configurations and combinations of: BBISTM 350-A, 350-B; BBISDM 360; BBISRM 370; P-BBISTM 351-A, 351-B; P-BBISDM 361; and P-BBISRM 371 illustrated herein, to further ensure reliable data. This is because even if the present background test and repair apparatus and methods ensure a memory that is free of failed and weak memory cells, scrubbing is still useful to detect and/or correct a single event upset from an APH. In lieu of using ECC bits for such a rare event as the APH, a lower-overhead single parity bit is used in one embodiment to provide detection, though not correction of the single event upset. The scrub operation is implemented using the MAC in the MM 204 or alternatively using a non-programmable or a programmable BBIST 350-A, or dedicated logic in MM 204.

Referring now to FIG. 2D, a block diagram of an integrated circuit having a superset of features including: P-BBIST, P-BBISD, P-BBISR, programmability and a scrubbing operation is shown, according to one or more embodiments. This embodiment includes applicable blocks and descriptions as provided in prior figures. P-BBISRM 371 is optionally coupled to scrub function 210 and to RM 205 for increased control and functionality, thereby allowing an interface between a repair being undertaken, and a follow-up scrub operation on the original memory, which might have a disposition to further weak cells, and the replaced memory.

While a scrub operation using ECC is illustrated in FIGS. 2C and 2D, the present embodiment does not require the use of scrubbing, and is capable of avoiding the use of ECC bits as unnecessary, given that weak memory cells are detected and repaired early, thus avoiding occurrences of failed memory cells. Consequently, the overhead of memory is reduced by the quantity of ECC bits otherwise used for a given portion of data, e.g., eliminating the eight (8) additional bits of ECC code for a 64 bit data for a ten percent reduction in overhead. This can translate into a larger usable memory size for a given die size, or a smaller die for a given usable memory size. However, the present disclosure does not exclude ECC, and can optionally use this information, that is read either with or without margin, to detect, correct, and repair errors early, thereby ensuring data integrity with no user read/write failures.

Arbitrator

Figure 3A:
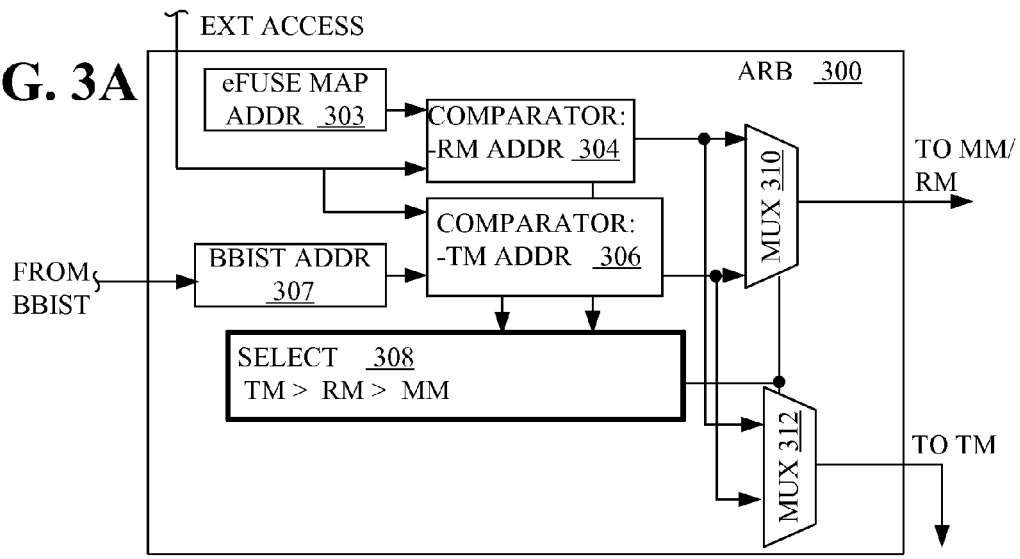
FIG. 3A is a block diagram of an arbitrator for directing accesses to the appropriate physical memory location, according to one or more embodiments.

Referring now to FIG. 3A, a block diagram of the arbitrator 300 for directing accesses to the appropriate physical memory location is shown, according to one or more embodiments. Arbitrator 300 includes comparators 304, 306 coupled in parallel to receive an external address and compare the external address with physical memory address locations on the IC for a hit, that is, a match. In comparator 304, the external address is compared to addresses from main memory 204 whose contents have been replaced by corresponding contents of redundant memory 205. The addresses in main memory whose contents are now stored in redundant memory are stored either temporarily in volatile memory or permanently in an eFUSE array, the addresses of both existing in eFUSE MAP ADDR 303. The second comparator 306 receives the external address and compares it to an address for a target memory under test (TMUT) by BBIST, e.g., addresses stored in BBIST address memory 307 corresponding to data that was temporarily moved to TM 214 from either MM 204 or RM 205 while TMUT is tested. Consequently, a selector 308 is coupled to receive the results of both comparators 304, 306 and is coupled to drive a switch, e.g., muxes 310 and 312. These muxes select the highest priority address and the appropriate routing for the data to the correct physical location, e.g., either to MM 204/RM 205 or to TM 214. Selector 308 has the following prioritization: i) TM 214 memory is the highest priority if a match exists, because the TMUT can be either MM 204 or RM 205; ii) RM 205 is the second priority if a match exists, because it supersedes the MM 204 address that it replaces; iii) MM 204 is the lowest priority, being the original memory location for which data is typically stored (shown as TM>RM>MM). Restated, if the external address is not under test and has not been repaired in redundant memory, then by process of elimination, the physical address is in the MM 204. By operating comparator 306 for TM 214 in parallel with comparator 304 for MM 204/RM 205, the present embodiment renders this BBIST checking for the TMUT as transparent to the user.

Given a segmented memory architecture, e.g., as shown in subsequent FIG. 5, having memory modules (MEMMOD) of MOD 0 to MOD N, where N≥1 and in a present embodiment is 32, and wherein each memory module has M wordlines (WL), wherein M≥1, and in a present embodiment is 64, and wherein each wordline comprises C columns, or words, where C≥1, and in a present embodiment is 16, and wherein each word is comprised of W bits, where W≥1, and in a present embodiment is 72 bits, the ARB 300 is specific to a give partition and a given bank of memory. Thus, comparators 304, 306 only need compare MEMMOD [4:0], WL [5:0], and word [3:0] of the external address to the eFUSE map address and the TMUT address from BIST to determine whether a match exists. If the TMUT is not fully transferred from MM 204 or RM 205 into the TM 214, then the column portion of the address does need to be compared to determine whether the data resides in MM 204 or TM 214, depending on where the transfer operation left off. If the TMUT is fully transferred from MM 204 or RM 205 into the TM 214, then the column address does not need to be compared, as all the data for the WL is located in the TM 214. A redirect check bit in BBIST address block 307 is set high when the TMUT is fully transferred to the TM 214, thus eliminating the column compare and saving power and time. To help reduce latency, if a MEMMOD has a hit in both the RM address comparator 304 and the TM address comparator 306 when it starts the compare operations and before it completes it, then the access to the appropriate wordline in both the RM and the TM can be started in parallel prior to the completion of the compare operation in 304, 306. This reduces the latency required for equalization and precharge of the wordlines.

Background Test Module

Figure 3B:
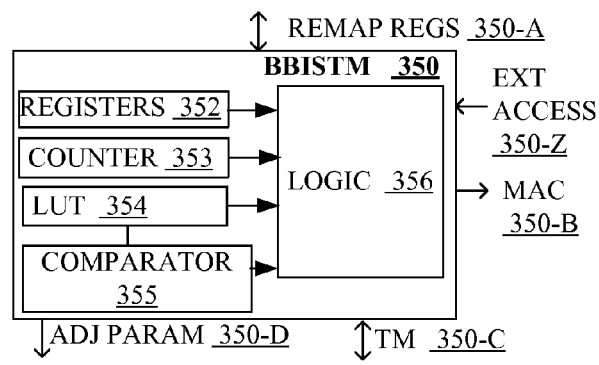
FIGS. 3B-3C are block diagrams of the background BIST controller (BBC) module in both a non-programmable and a programmable configuration, respectively, for sequencing the test operations, according to one or more embodiments.
Figure 3C:
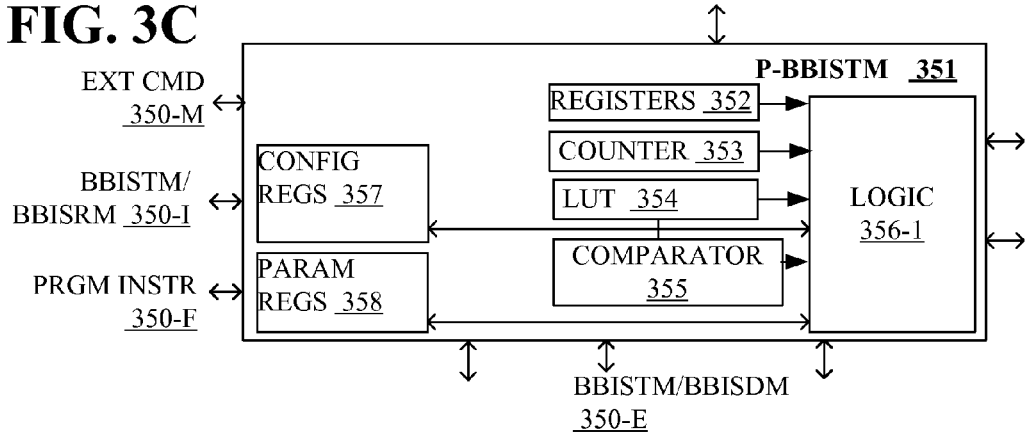

Referring now to FIGS. 3B-C, block diagrams of the background BIST controller (BBC) module (BBISTM) 350 and programmable BBISTM (P-BBISTM) 351 for sequencing the test operations is shown, according to one or more embodiments. The common baseline portions of BBC 350 and 351 include registers 352, for status and settings, coupled to a counter 353, for counting through portions of memory to be tested, e.g., the multiple words in a wordline, and the multiple wordlines in a given MM 204, e.g., and finally the multiple MEMMODS inside the bank of a given partition of MM 204. Comparator 355 is coupled to the look up table (LUT) 354, which stores data in memory, and counter 353 to determine current address location within the range of the TMUT. Logic 356 is coupled to the components shown to enable the operations of flowcharts described in FIGS. 9C, and 10A-10C. BBISTM (BBC) 350 has I/Os including: REMAP REGS 506-0 to 506-N of FIG. 5A (equivalent to BBIST ADDR 307 of FIG. 3A) for storing the address of the TMUT, which is then provided to comparator 306 of FIG. 3A. BBISTM 350 has I/O 350-Z for receiving external access information, I/O 350-B for interfacing MAC of MM 204, in order to specify access and refresh operations by MAC for TMUT in MM or RM, during free cycle from external accesses. Thus, operations from the BBISTM 350 are interlaced with external accesses and MAC operation that manage physical memories MM 204, RM 205, and TM 214. BBIST 350 also has output 350-D for adjustable parameters, e.g., valid or flag bits, select or enable signals that effect an adjustable or selectable parameter level. The registers can contain default parameter settings, such as voltage levels to select, or different refresh periods for different types of tests, e.g., a more stringent refresh period for a memory with low field hours or a less stringent refresh period for a memory with high field hours, both of which are beyond the specification refresh period. Counter 353 and LUT 354 indicate a present status of the TMUT progressing through one of a number of possible serial and/or combined testing parameters, e.g., voltage test, refresh test, cycle time test, etc. For example, a LUT can list the address, and memory module, and line number, and what number test has been tested, such as Test 1—under voltage=passed, Test 2—over voltage=passed, Test 3—extended refresh period=in process, wordline 4 failed, wordline 5 is TMUT, etc. The BBISTM 350 identifies a given adjustable parameter and a parameter level, e.g., chosen from the LUT 354, and communicates it to the appropriate circuit with adjustable or selectable parameter levels at a timing appropriate for applying it to the TMUT, as shown in subsequent FIGS. 5B and 5C. For example, a supply voltage and a reduced supply voltage option are available, and when the TMUT is opportunistically selected for a write, then the select bit associated with the TMUT WL address chooses the reduced Vdd rather than the specification Vdd in order to stress test the TMUT. External command 350-M can be received from host to initiate test at host's discretion.

Referring now to FIG. 3C, the programmable version of BBIST module (P-BBISTM) 351, is illustrated, according to one or more embodiments. The input/outputs (I/Os) that are the same as those of BBIST 350 are not labeled, while the unique I/Os are labeled as PRGM INSTR 350-F, BBISTM/ BBISDM 350-E, and BBISTM/BBISR 350-I. The PRGM INSTR 305-F receives instructions, parameter settings, thresholds, test sequences, and/or etc. as provided by a user via a channel such as a serial port, e.g., a SPI or JTAG port, a bus, or a SERDES link via a communication protocol between host and IC. Programmable data is stored in local memory on P-BBISTM 351, e.g., in configuration or parameter registers 357, 358 that are coupled to logic 356-1, which has additional circuitry beyond baseline logic 356 to accommodate the inputs and the selectabilty, e.g., muxes, to accommodate the programmable data. Programmable configurations can provide a setting for altering logic, e.g., an input value to mux for selecting or disabling a branch in a test, such as provided in subsequent flowchart operations in FIGS. 9A-9C and 10A-10C. Programmable thresholds can also change binary settings, e.g., choose from one of two sub Vdd values: Vdd-y or Vdd-x, where x>y. Alternatively, the programmable data can be a quantitative value for any of the parameters configured to be tested, e.g., a value for local bias 572 shown in FIG. 5B, or a variable number of cycles for withholding an enable signal to refresh the TMUT as shown in FIG. 5C. The I/O for BBISTM/BBISDM 350-E provides for communication between BBISTM 350 or P-BBISTM 351 and with BBISDM 360 or P-BBISDM 361 in subsequent figures. The I/O 350-I provides test and diagnostic results to the BBISRM 370 for implementing repairs.

More detail on programmable features and other architecture is provided in co-pending U.S. provisional Patent Application No. 61/702,732, filed on Sep. 18, 2012, entitled "PROGRAMMABLE MEMORY BUILT IN SELF REPAIR CIRCUIT," by Rajesh Chopra et al., and in U.S. patent application Ser. No. 13/030,358, filed on Feb. 18, 2011, entitled "PROGRAMMABLE TEST ENGINE," by Rajesh Chopra et al., and in co-pending U.S. provisional Patent Application No. 61/702,732, filed on Jun. 6, 2012, entitled "HIGH UTILIZATION MULTI-PARTITIONED MEMORY WITH WRITE CACHE, BIST, AND STATISTICS FUNCTIONS," by Michael Miller, et al., wherein all of said applications are also incorporated by reference herein in their entirety.

Background Diagnostics Module

Figure 3D:
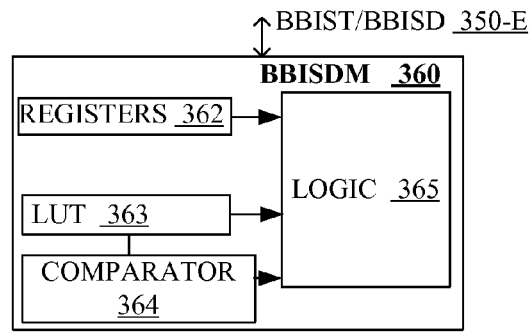
FIGS. 3D-3E are block diagrams of the background built-in self-diagnostic module (BBISDM) in both a non-programmable and a programmable configuration, respectively, for diagnosing results of the BBIST, according to one or more embodiments.
Figure 3E:
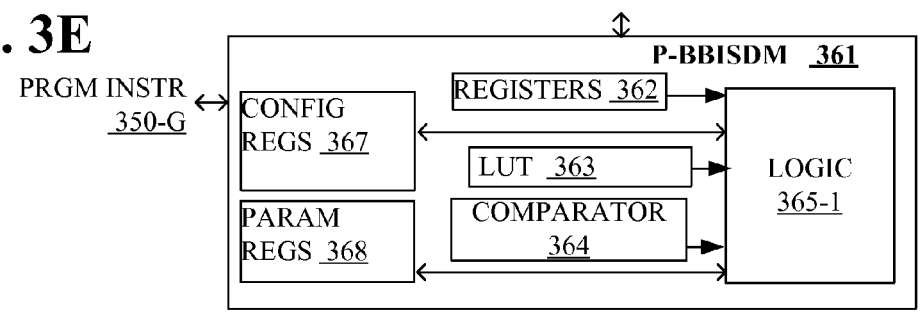

Referring now to FIGS. 3D-3E are block diagrams of the background built-in self diagnostic module (BBISDM) in both a non-programmable and a programmable configuration, respectively, for diagnosing results of the BBIST, according to one or more embodiments. The common baseline portions of BBISDM 360 and P-BBISDM 361 include registers 362 for local results of diagnostics, and interface to BBISTM 350 or P-BBISTM 351 through I/O BBIST/BBISD 350-E. Logic portion of BBISDM 360 and P-BBISDM 361 implement flowchart operations for diagnostics per FIG. 11. Similar to FIG. 3C, a programmable version of BBISDM, (P-BBISDM) 361 has an I/O for PRGM INSTR 350-G for receiving programmable instructions in the form of configuration or parameters/thresholds, which are stored in configuration registers 367 or parameter registers 368.

Figure 11:
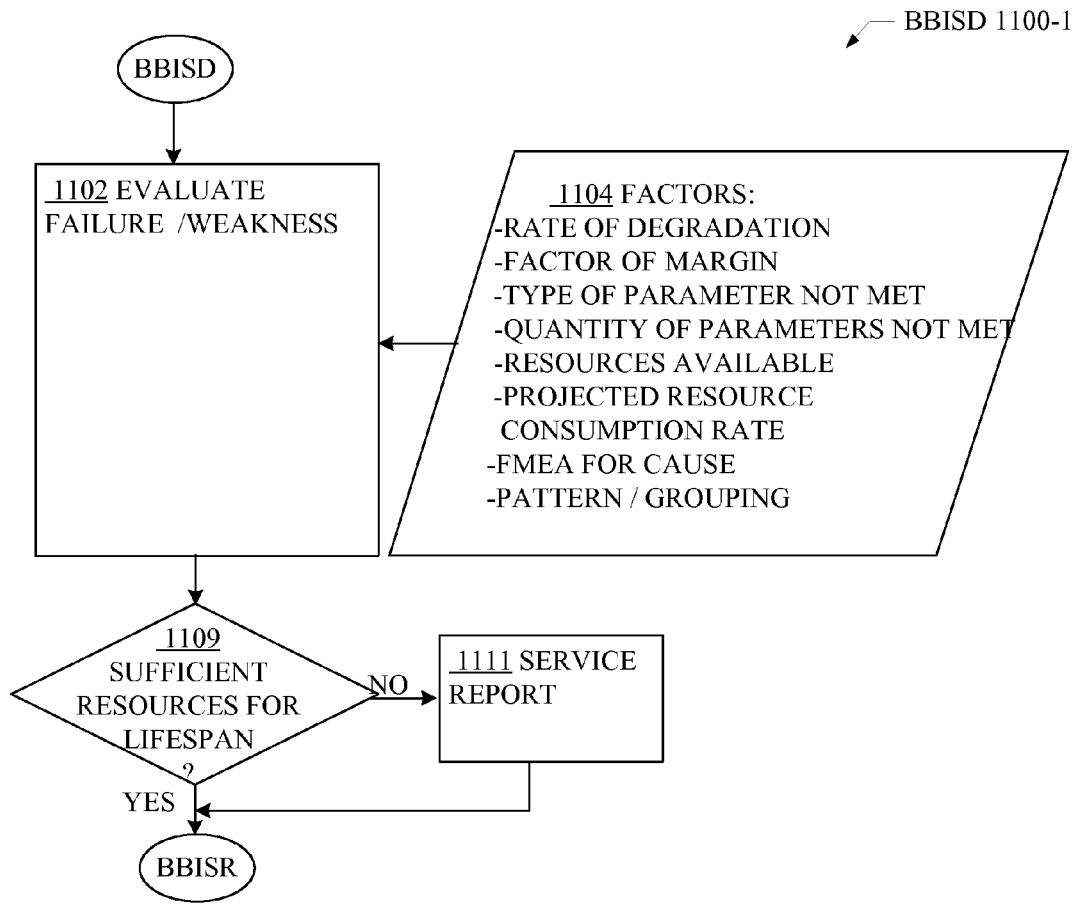
FIG. 11 is a flowchart illustrating the operation of BBISD on memory, according to one or more embodiments.

The BBISDM 360 and P-BBISDM 361 use hard-coded logic 365 and 365-1 for a low-latency embodiment to look for patterns, e.g., an array of muxes that result in a predetermined disposition based on the treed options in the mux per flowchart operations from FIG. 11. Programmable thresholds can identify diagnosis criteria, such as those provided in FIG. 11, such as acceptable factor of margin, rate of degradation, projected redundant memory resource models based on empirical data, failure modes and effects analysis (FMEA), etc. For example, a first set of muxes can determine whether a memory cell identified by BBISTM 350 is a weak or failed memory cell, per a bit setting in a LUT. Another set of muxes cascaded thereafter can inquire if there are adjacent memory cells that are weak or failed, based on a comparator sort in turn based on a compare operation of a look up table having recorded address locations for weak or failed memory cells. Different patterns of failure or weakness can dictate different modes of repair per the background diagnostics module that will be executed by the background repair module and/or notice to a host. The notice to the host can be in any format, such as a flag in the error register, a handshake protocol, an interrupt signal, etc. Alternatively, a microcontroller can execute code that implements the flowchart operations for diagnostics per FIG. 11.

Background Repair Module

Figure 3F:
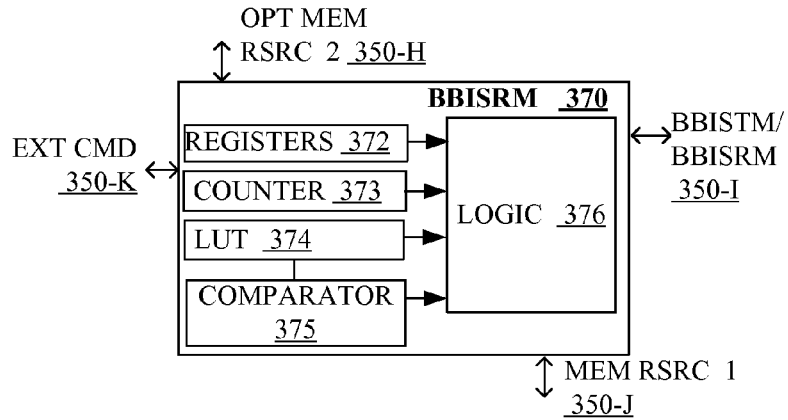
FIGS. 3F-3G are block diagrams of the background built-in self repair module (BBISRM) in both a non-programmable and a programmable configuration, respectively, for repairing memory, according to one or more embodiments.
Figure 3G:
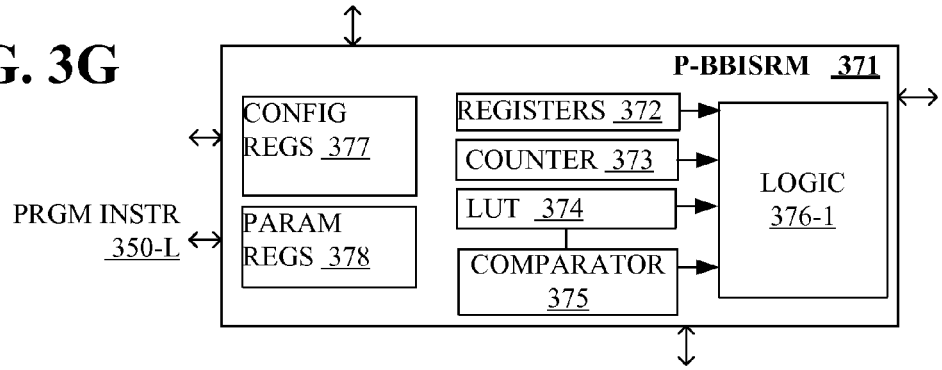

FIGS. 3F-3G are block diagrams of the background built-in self repair module (BBISRM) in both a non-programmable and a programmable configuration, respectively, for repairing memory, according to one or more embodiments. The common baseline portions of BBISRM 370 and a programmable version of BBISRM, (P-BBISRM) 371 include registers 372 for local results of repairs, and interface to BBISTM 350 or P-BBISTM 351 through I/O BBIST/BBISR 350-I. Common I/Os also include memory resource 1 (MEM RSRC 1) 350-J, a local redundant memory, and optional memory resource 2 (MEM RSRC 2) 350-H, the GBR memory. Logic portion 376 and 376-1 of BBISRM 370 and P-BBISRM 371, respectively, implements flowchart operations for repair per FIG. 12. Similar to FIG. 3C, a P-BBISRM 371 has an I/O PRGM INSTR 350-L for receiving programmable instructions in the form of configuration or parameters/thresholds, which are stored in configuration registers 377 or parameter registers 378. For example, single bit repairs are the default repair for a non-programmable BBISRM 370. However, a programmable P-BBISRM 371 can be programmed to respond to new failure modes not anticipated at production by providing a different hierarchy of repair, e.g., utilizing a redundant memory block to repair early failures in a certain location or portion of main memory per empirical data, thereby resulting in a more efficient repair using the memory block. Alternatively, the host can provide an external request to execute a repair on an address that host has identified as being weak or failed, per an external command 350-K of FIG. 3F.

The BBISRM 370, P-BBISRM 371 use hard-coded logic 376 and 376-1 for a low-latency embodiment to implement the sequences of operations to implement a repair. This logic may also decide which of multiple possible repair resources should be utilized based on the input from BBISDM (diagnostics) and/or BBISTM (test). One embodiment of BBISR is provided in subsequent FIG. 4. Alternatively, a microcontroller can execute code that implements the flowchart operations for repair per FIG. 12.

Hierarchical Shared Memory Resource

Referring now to FIG. 4, a block diagram of distributed BBISTM on a multi-partitioned memory chip is shown, according to one or more embodiments. IC 400 is one embodiment of IC 200-B of FIG. 2B with IC 400 having implementations of BBISR 370, BBIST 350-B, RM 205, MM 204, and GBR 250 functionality. Memory core 404 includes a plurality of memory partitions, partition P0, 500-0, through partition PN, 500-N, where N>1. An exemplary memory bank P0 is more fully illustrated in subsequent FIG. 5. Partitioning memory is useful for pipelining memory accesses thereby allowing slower memory to be parallelized to a faster interface, e.g., a SERDES interface to memory. Each partition 500-0 through 500-N includes a dedicated background built-in self test/repair module (BBISTR) module 550-0 through 550-N, and dedicated local redundant memory RM 530-0 through 530-N, thereby allowing each partition to have standalone test and repair apparatus and operations in parallel with each other.

BISR engine 430 is one embodiment of P-BBISRM 371 of FIG. 3G with IC 400 internal inputs from BBIST 426 and/or ECC operation 422, embodying BBIST/BBISR input 305-I, and with external inputs from user via SPI port input 424 and/or external fault (EXT FAULT) 428 embodying external inputs 350-K from user. BISR engine 430 holds repair information in volatile memory 439, embodying registers 372, for redundant memory 530-0 through 530-N from each memory partition and for repairs using GBR 452 for all memory partitions in. BISR engine 430 can make the repairs permanent by employing charge pump (CP) 442 during IC 400 field operation to program repair information into eFUSES 440. The decision to capture repair information permanently can be based on internal criteria (initiates prior to shutdown) or based on an external user decision e.g., program instruction 350-L via input 428. As an alternative to eFUSES, embedded flash memory can be used to capture all the soft repairs in volatile memory and make them permanent.

Output from the parallel partitioned memory in IC 400 is muxed down to two ports shown via data out (DOUT) mux 454. A global bit replacement block 452 provides a global memory repair that is shared amongst all the partitions 500-0 through 500-N to provide a final hierarchical repair screening with a granularity of a single bit replacement available to all outgoing data. Granularity of any size can be employed by GBR depending on the resolution of the repair memory, and on the muxing provided by block 452, e.g., a pair of bits, a word, etc. and also as described in patent application "Shared Memory Redundancy" previously incorporated.

Figure 5A:
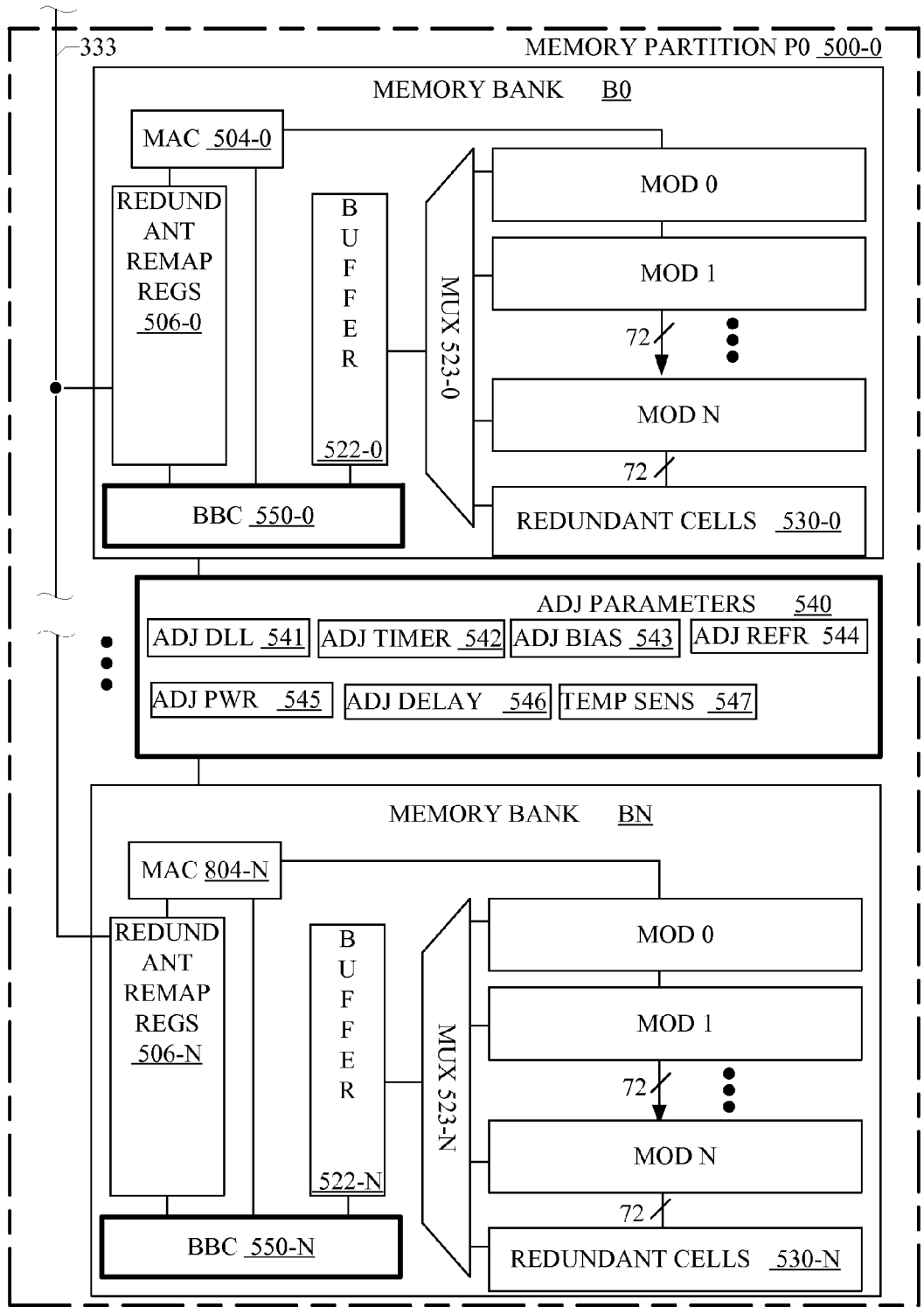
FIG. 5A is a diagram of a distributed BBIST on a multi-banked partition of a memory chip having adjustable parameter settings, according to one or more embodiments.

Referring now to FIG. 5A, a block diagram of a distributed BBIST on a multi-banked partition of a memory chip having adjustable parameter settings is shown, according to one or more embodiments. Memory partition P0, 500-0, is one of multiple partitions in IC 400 of FIG. 4, the number of which depends on the architecture, the overall memory size desired, and the access rate desired. Memory partition 500-0 includes a plurality of memory banks B0 through BN, as noted in FIG. 4, where N≥1, and is N=31 in one embodiment and includes a block of adjustable parameters 540 that is distributed on a partition by partition basis, or is centralized for service to the whole IC.

Adjustable parameters block 540 can include one or more of the listed circuits having adjustable (ADJ) or selectable parameters that are related to the operation and access of memory: delay locked loop (DLL) 541, timer 542, bias 543, refresh 544 (REFR), power 545 (PWR), delay 546, etc., as well as sensors, e.g., temperature sensor 547 (TEMP SENS), etc. An example of a selectable power supply level circuit is illustrated in subsequent FIG. 5A, while an example of an adjustable refresh circuit is illustrated in subsequent FIG. 5B. In one state, circuits in adjustable parameter block 540 satisfy specification requirements for external memory access. In another state, a test state, circuits in adjustable parameter block 540 intentionally do not satisfy specification requirements in order to either quantify the margin for different parameters required to manifest (identify and quantify) weak or failing/failed memory cells and/or to screen out and repair portions of memory at a predetermined threshold value provided by empirical data to ensure memory operation throughout its operational lifespan. That is, circuits in adjustable parameter block 540 have a performance level that has a margin to the specification performance level in order to stress test memory at a harsher condition than specification, whatever that harsher condition may be, e.g., lower driving voltage, longer refresh period, etc. As an example, an operation could seek the shortest refresh period required for the weakest memory cell in a given partition or throughout the entire memory. Additionally, registers in BBISTM can store and/or communicate statistical information such as variance or standard deviations of distribution of test results.

The BBC 550-0 is one embodiment of baseline BBISTM 350 of FIG. 3B, being coupled to: redundant remap registers 506-0 as embodying I/O 350-A; to MAC 504-0, through which the TMUT in modules MOD 0 through MOD N including redundant cell module 530-0 is affected, as embodying I/O 350-B; to temporary memory buffer 522-0, as embodying, I/O 350-C; and to adjustable parameters 540 as embodying I/O 350-D. MUX 523-0, 523-N selectively captures the TMUT for their respective bank. BBC 550 has logic that implements the repair operations of FIGS. 9C and 10A-10C as applied to FIG. 4.

Adjustable Test Circuits

Figure 5B:
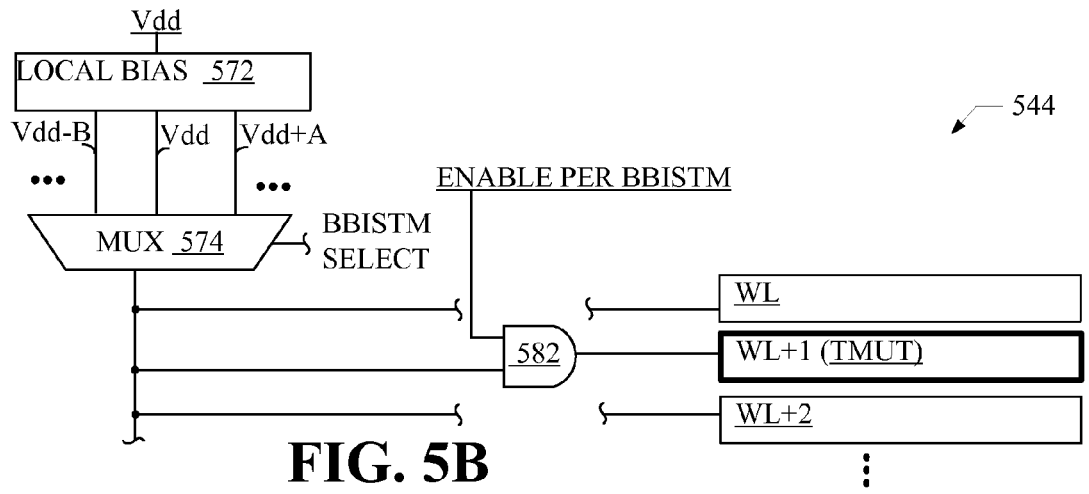
FIGS. 5B-5C are diagrams of access circuitry having adjustable or selectable performance levels, for a selectable power supply and a selectable refresh period, respectively, according to one or more embodiments.
Figure 5C:
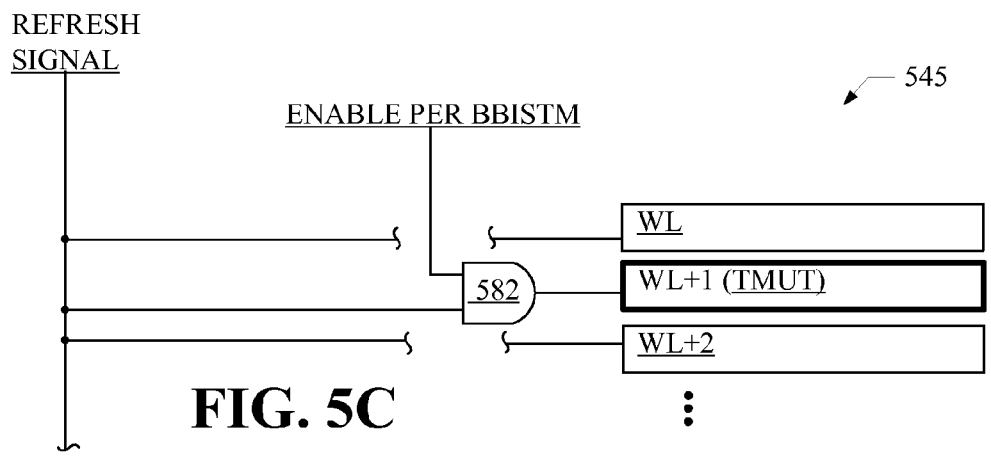

FIGS. 5B-5C are diagrams of access circuitry having adjustable or selectable performance levels such as a selectable power supply and a selectable refresh period, respectively, according to one or more embodiments. The purpose of the test circuits is to control the surrounding environment, electrically or otherwise, of the TMUT and to induce leakage, to marginalize the performance of the cell, to create a write or read disturb, to create inductive wordline-to-wordline or bitline-to-bitline coupling effects, etc. The physical pattern of memory will dictate the appropriate configuration of test values to the TMUT and to the adjacent cells. A gate 582 on wordlines, shown only for the TMUT, controls which wordline is enabled per the BBISTM, and optionally receives what selectable parameter value per the BBISTM, e.g., an in-specification parameter or a stressed parameter.

In FIG. 5B, selectable power supply circuit 544 includes a local bias circuit 572 coupled to power Vdd and to mux 574. The mux 574 selects between a number of different voltage options provided by the local bias, including an in-specification voltage level of Vdd, a sub-specification under-voltage level of Vdd-B, and an above-specification over-voltage level of Vdd+A. The local bias function is known by those skilled in the art, e.g., DC-DC converters, resistive voltage drop, etc. based on control signals from BBISTM, e.g., BBC 550-0 to a test under circuit, e.g., WL 1 (not shown) of memory module MOD 1 in Bank B0 of FIG. 5A. The voltage level for circuit 544 is provided by the MAC or by the BBISTM as an input to MUX 574 at the correct line sequence per the tables below.

Any voltage pattern can be chosen for the TMUT as well as one or more adjacent memory cells, wordlines, bitlines, etc.

that are not being accessed by the host, in order to stress or disturb the TMUT in a desired way. For example, the following embodiment illustrates how the TMUT is interleaved between portions of memory, e.g., WLs that are not under test. The TMUT (WL+1) is subject to a parameter, e.g., voltage, refresh period, etc., having a value that is different from a value of that parameter used for the balance of the memory not under test, e.g., WL, WL+2, etc. That is, the TMUT is subject to a parameter value that stresses the performance of the TMUT, e.g., a lower driving voltage, a longer refresh period, etc. and that does not stress the performance of the surrounding memory not under test. This is even true while access operations can be occurring, whether internal or external, to the portion of memory not under test. For example, In the following Table 1, if the wordline WL+1 is the TMUT, and WL is the adjacent wordline above it and WL+2 is the adjacent wordline below it, then WL and WL+2 have in-specification (SPEC) voltages, while WL+1 has an under or an under voltage condition. Table 1 provides the turn on voltages for noted lines, e.g., to toggle adjacent WL to induce coupling and disturbs to the TMUT.

TABLE 1

| Voltage Test Pattern 1 | | |
|---|---|---|
| STATUS | WORDLINE | VOLTAGE |
| NOT TESTED | WL | SPEC VOLT |
| TESTED | WL + 1 | UNDER-VOLT |
| NOT TESTED | WL + 2 | SPEC VOLT |

In another embodiment, not only is the TMUT subjected to an altered voltage, but surrounding memory is subject to a same or different altered voltage as well, e.g., at least one adjacent wordline and/or bitline. Thus, in Table 2 below, wordlines WL and WL+2, adjacent to TMUT WL+1, are subject to an out of specification voltage that is over-voltage, while the TMUT WL+1 is subject to an out of specification voltage that is an under-voltage. The combinations of different voltage levels can also be used simultaneously on different portions of memory, e.g., altering voltage levels on both adjacent bit lines and adjacent word lines at the same time to create a higher stressed condition on the TMUT. In this embodiment, if the parameter on the adjacent memory is taken out of spec, rather than just to a specification limit, which is also a valuable stress test, then the data from the adjacent memory that was taken out of specification is optionally saved into a temporary memory as well, for providing reliable future access to the data from the adjacent memory cells while the adjacent memory is utilized in the test.

TABLE 2

| Voltage Test Pattern 2 | | |
|---|---|---|
| STATUS | WORDLINE | VOLTAGE |
| NOT TESTED | WL | OVER-VOLT |
| TESTED | WL + 1 | UNDER-VOLT |
| NOT TESTED | WL + 2 | OVER-VOLT |

In contrast, FIG. 5C illustrates a selectable refresh rate circuit provided by the adjustable refresh circuitry 545 that includes a gated 582 refresh signal and an enable line from BBISTM to the gate 582 that counts how many refresh cycles, e.g., "C" cycles, have been skipped for the TMUT. Similarly, MAC can withhold a refresh ENABLE for circuit 545 when the MAC sequence reaches the WL for the TMUT for a desired number of refresh cycles stored in registers 352 and counted by counter 353, both of FIG. 3B. A selectable voltage level for the refresh could be added to circuit 545, similar to that shown in circuit 544, to further stress the TMUT when it did receive a refresh.

TABLE 3

| Refresh Test Pattern | | |
|---|---|---|
| STATUS | WORDLINE | REFRESH RATE |
| NOT TESTED | WL | EVERY CYCLE |
| TESTED | WL + 1 | BYPASS "C" REFRESH CYCLES |
| NOT TESTED | WL + 2 | EVERY CYCLE |

Figure 5D:
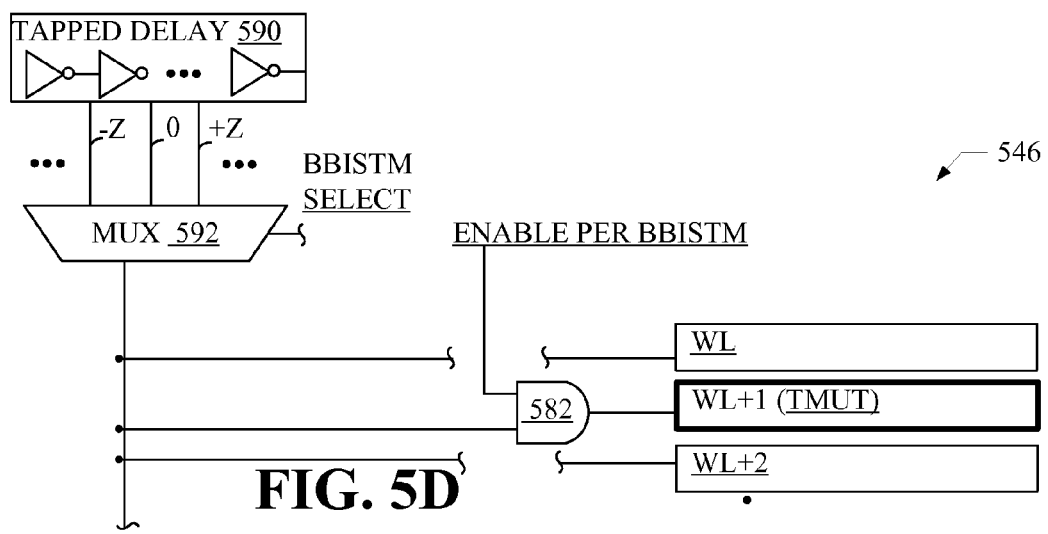
FIG. 5D is a diagram of a selectable delay signal circuit for testing response times of memory cells and related hardware according to one or more embodiments.

As a final example, FIG. 5D illustrates a selectable delay signal circuit 546 for testing response times of memory cells and related hardware. The tapped-delay circuit 590 has variable delay choices, e.g., delaying +Z, advancing −Z, zero delay, etc. at any resolution and range desired. The multi-tapped delay circuit 590 can be a globally distributed signal, or a locally generated signal from a reference signal. For example, the delay can be at the edges of the specification, nominal specification, or out of specification. The appropriate delay desired per the test protocol is selected via BBISTM select signal to MUX 592 for the appropriate word line. The delay can be specified on one or more timing operations such as a precharge, equalization, column select, sensing by a sense amp, etc.

TABLE 4

| Delay Test Pattern | | |
|---|---|---|
| STATUS | WORDLINE | TIMING |
| NOT TESTED | WL | NOMINAL |
| TESTED | WL + 1 | DELAY "D" TAPS |
| NOT TESTED | WL + 2 | NOMINAL |

Access circuitry having adjustable or selectable performance levels such as circuits 544, 545 and 546 are disposed throughout the memory block similar to a non-BIST memory block. The selectabilty allows a granularity to the target memory under test (TMUT), e.g., in the present embodiment, a wordline at a time is tested, and the adjusted parameters are provided on that basis. In another embodiment, granularity can be based on multiple word lines (coupled to a common supply circuit or refresh) or can be based on a bit line, column, group of columns, etc. Any incidental latency from a gate operation that enables the concurrent BBIST and access during field use is not significant in the overall access scheme, e.g., less than one percent of a clock cycle, and can be compensated for with timing alignment, parallelizing operations, etc.

Implementing this background testing does not result in any apparent latency impact, and does not affect surrounding circuitry, e.g. memory, from the stressed parameter of the TMUT, because the operational parameters for the portion of memory not under test are controlled separately to be within specification range. As an example, there is essentially no interruption for implementing the increased refresh period test on the TMUT, because the MAC is already required to sequence through all the WLs in the memory module and bank, and the test consists of simply bypassing the refresh based on the gated signal per 582. Similarly, there is no interruption for the test sequence in Table 1, where the TMUT has an out of specification voltage level compared to the adjacent lines that are in-specification.

While the test on the TMUT occurs on an interleaved fashion with adjacent memory, it also occurs in parallel with other portions of memory. That is, test operations on TMUT portions of memory in multiple memory banks and/or other partitions can operate simultaneously, because the memory is architected to have partitions that operate independently and because banks are architected to operate independently, wherein at least two banks within a partition can also have simultaneous accesses.

The values of the parameters used to operate/access the TMUT are different from the values of the parameters used to operate/access portions of memory not under test. For example, the value of parameters used to operate/access portions of memory not under test will be within specification limits, in order to yield reliable data. However, the values of the parameter used to operate the TMUT can be either in specification limits, but skewed to a limit that stresses the performance of the TMUT, or can be outside of specification limits, in a direction that will cause the TMUT to be stressed and more likely manifest a weak memory cell. Additionally, corner cases of values for operating parameters can be used to stress test the TMUT. That is, values of more than one operating parameter can be skewed to specification limits that stress the TMUT from the cumulative effect. For example, reducing a driver voltage to the low limit, and combining that with a shortened access time, will more likely manifest a weak cell than stress testing either of those parameters separately. Similarly, combining parameters that have values outside of specification limits can also create a more stringent stress test on the TMUT. The circuits not under test will be operated within specification limits, and at a nominal setting, such as the median value.

Modules & Line Cards

FIGS. 6A-6C and 7A-7E provide different combinations of memory and die with and without the BBIST, BBISD, and/or BBISR (TDR) functionality therein in both multi-chip modules (MCM) and line card applications. Different data applications have different performance levels that can tolerate different levels of errors with the most sensitive applications requiring TDR functionality and with others not requiring TDR functionality. Similarly, different applications have different price points, with some applications demanding low-cost commodity memory. Thus, one solution is to tailor the performance and cost of memory with modules that combine different cost and capability memories together and route data to the applicable performance memory by their addresses. The present disclosure is well suited to a wide range of combinations of chips having different functionality, with the following illustrations providing only an exemplary subset.

Referring now to FIG. 6A, a block diagram of a side-by-side (SBS) multi-chip-module (MCM) 600-A with one memory chip 604 having BBIST 605 and the other memory chip 606 having BBISTR 607 is shown, according to one or more embodiments. Multiple chips can be included in an MCM, wherein each of the multiple chips has a same or a different configuration regarding BBIST, BBISD, and/or BBISR. The first memory chip 604, configured as an access (descriptor) function, has a BBIST 605 block. The second memory chip 606, configured as a meter and statistics chip for tracking rates and usages of multiple users of a network. Memory chip 606 has a BBISTR 607 block with additional functionality for repair, because the meter and stats data is more critical and because of its higher access rates to same memory locations, and thus a higher wear out rate. With the BBISTR 607 block, the meter/stats chip 606 will be evenly matched to the lifespan of the access (descriptor) chip 604, and thus will ensure the specified MCM life.

Referring now to FIG. 6B, a block diagram of a SBS MCM 600-B with standalone chip BBISTR and with legacy memory chips not having BBIST, BBISD, BBISR is shown, according to one or more embodiments. MCM 600-B provides a solution for increasing the lifespan and reliability of legacy or commodity memory 610, 612 by utilizing a standalone chip with BBISTR functionality 611, 614. Chips 611, 614 utilize a BBISTM such as 350 of FIG. 3B and/or a BBISRM such as 370 of FIG. 3F, with redundant memory thereon to provide the full suite of offloading a TMUT from the main memory in 610, 612. A control signal from BBISTR 611, 614 to legacy memory 610, 612, respectively, provides ability offload data from commodity memory 610 or 612 to TM of BBISTR 611 or 614, providing that TM be of sufficient size to capture all the data in commodity memory 610 or 612. Thereafter, BBISTR 611 or 614, would have controllability to adjust parameters on board commodity memory 610 or 612 to the extent that they provide control bits for same, or to the extent that BBISTR 611 or 614 could alter external references provided to commodity memory 610 or 612, such as Vdd, reference clock signals, request timing, test patterns, etc. The granularity of the test would be on a whole chip basis at worst case, and a sectioned portion of memory if commodity memory 610 or 612 provided that granularity and control.

Referring now to FIG. 6C, a block diagram of an MCM 600-C having standalone chip redundant memory resources and having memory chips with BBIST or BBISTR is shown, according to one or more embodiments. MCM 600-C utilizes chips 604 and 606 with built in BBIST 605 and BBISTR 607, respectively, as shown in FIG. 6A, and also includes an in-line NVM die 621 and 622, respectively, to provide sole redundant memory, or additional redundant memory to that existing in 604 or 606, for permanent repairs because of its nonvolatility. BBIST block 605 and BBISTR block 607 provide the test and/or repair function on chip to 604 and 606, but offload repair information to NVM chips 621, 622 that are coupled to memory chips 604 and 606.

Referring now to FIG. 6D, a block diagram of a hybrid stacked MCM 630 having multiple chips with through-silicon vias (TSVs) 641 therebetween, with at least one of the chips having BBIST is shown, according to one or more embodiments. The present description is well suited to a stacked die with a TSV because the lower chip 630-2 can provide the BBIST and/or BBISTR functionality for the whole MCM, thereby allowing one or more die 630-1 stacked thereon to be of lower cost commodity basis, without BBIST or BBISTR. The TSV means that signals for the upper die 630-1 pass through the TSV 641 from the lower die 630-2. The addressing scheme would identify the die to which the access was sought, and thus, the lower die 630-2 could act as the arbiter for both die. Additionally, a GBR hierarchical memory repair module can be located on the lower die 630-2 and would act as a final data output, screening the output data from both the upper die 630-1 and the lower die 630-2.

Referring now to FIG. 6E, a block diagram of a hybrid stacked package on package (POP) MCM 640 with an interposer 640-3 is shown, according to one or more embodiments. This embodiment is similar to the TSV MCM of FIG. 6D, where the bottom die 640-2 in the present figure has the BBISTR functionality built-in for higher reliability memory storage, and the top memory is commodity memory without any BBIST and/or BBISR functionality for less critical storage. Top die 640-1 is coupled the lower die 640-2 via data lines 643 (VIAS).

Figure 7A:
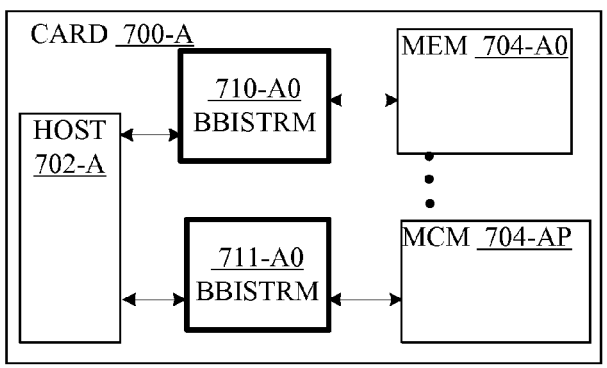
FIG. 7A is a block diagram of line card having a standalone BBISTR chip coupled to legacy host and legacy memory chip and/or legacy MCMs without BBISTR, according to one or more embodiments.

FIGS. 7A-7E show multiple chips, P, coupled on line cards, where P≥1. Referring specifically to FIG. 7A, a block diagram of line card 700-A having a standalone BBISTRM chip coupled to legacy host and to one or more legacy memory chips sans BBISTRM and/or to one or more legacy MCMs sans BBISTRM is shown, according to one or more embodiments. This embodiment is an entry-level use of the TDR functionality in standalone chips with no changes necessary to the host 702-A, to existing commodity single-die memory 704-A0, or to side-by-side or stacked MCM memory 704-AP. The BBISTRM chips 710-A0, 711-A0 contain modules provided in any of FIGS. 2A-2D minus the MM 204 and optionally minus the RM 205. A latency increase for data passing through BBISTRM chips 710-A0, 711-A0 could be offset by pipelining. In an alternative embodiment, a given BBISTRM chip, e.g., 710-A0 can be coupled to a plurality of memory chips. Throughout the present description, the diagnostics functionality is implied, but optional, when test and repair functionality is indicated.

Figure 7B:
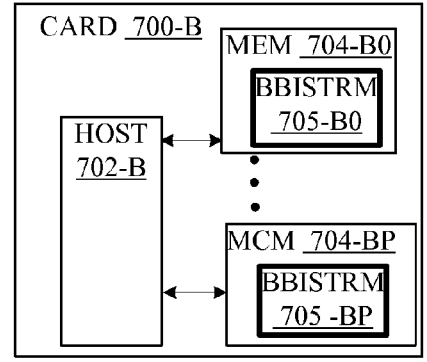
FIG. 7B is a block diagram of a line card having one or more resilient memory chips and/or MCMs with at least one having BBISTR, and a legacy host, according to one or more embodiments.

Referring now to FIG. 7B, a block diagram of a line card 700-B having one or more memory chips and/or MCMs with at least one having BBISTR, and a legacy host 702-B is shown, according to one or more embodiments. In the present embodiment, and throughout the present description, the host 702-B need not perform an EDC on the data received from chips having BBISTR, such as MEM 704-B0 to BM with BBISTRM blocks 705-B0 to BP. This is because the BBISTRM functions identify and repair failed memory cells and identify and repair weak or failing memory cells before they corrupt data.

Figure 7C:
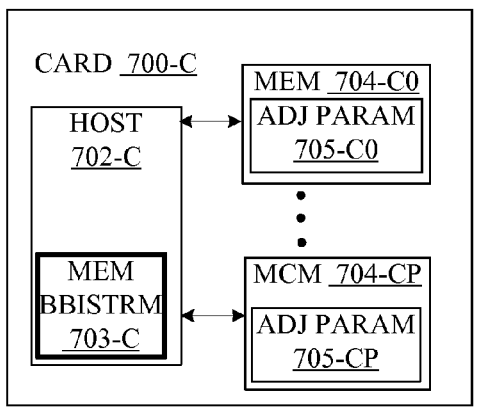
FIG. 7C is a block diagram of line card having a host with BBISTR and legacy memory chip and/or legacy MCMs without BBISTR, according to one or more embodiments.

Referring now to FIG. 7C, a block diagram of line card 700-C having a host with BBISTR and legacy memory chip and/or legacy MCMs without BBISTR is shown, according to one or more embodiments. To successfully stress test an IC, it needs some adjustable parameter setting block 705-C0 to 705-CP, even if simply for a refresh time for DRAM or eDRAM, e.g., by adjusting the refresh period or voltage. In another embodiment, host 702-C has control over a variable power supply to MEM 704-C0 and/or 704-CP for an extended period of time, e.g., more than a single access cycle, that would enable a dedicated memory test of at least a reasonable portion of the memory at a stressed power supply level, e.g., prior to a shutdown or at initialization or some other test period time. Additionally, Host 702-C has a built in memory with BBISTR 703-C therein for its on-die cache and/or it has an additional legacy memory chip for use as TM during the BBISTR of the individual legacy memory chips.

Figure 7D:
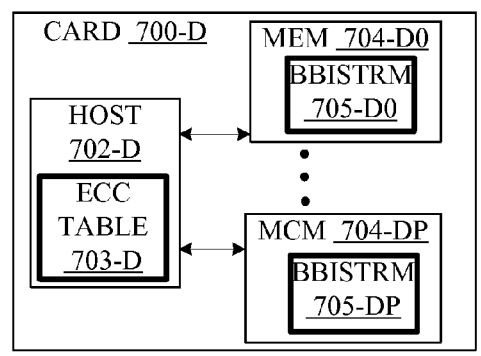
FIG. 7D is a block diagram of a line card with all components having BBISTR, including the host and the memory chip and/or MCMs, according to one or more embodiments.
Figure 7E:
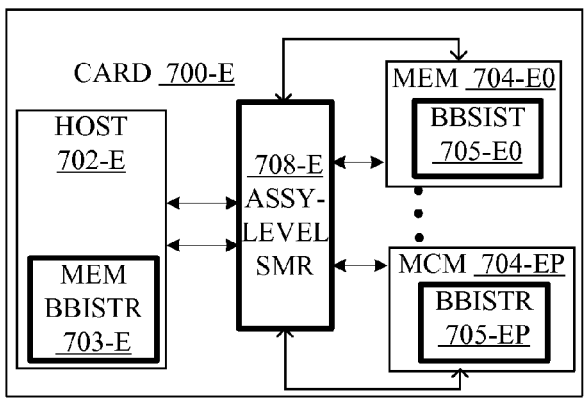
FIG. 7E is a block diagram of line card having all components having BBISTR, including the host and the memory chip and/or MCMs, and having an assembly level shared memory resource (SMR), according to one or more embodiments.

Referring now to FIG. 7D, a block diagram of a line card 700-D with all illustrated components having BBISTR, including the host and the memory chip and/or MCMs is shown, according to one or more embodiments. Host 702-D has an ECC table 703-D that is able to utilize the results of a BBIST of block 705-D0 even if all redundant memory resources on chip MEM 704-D0 have been consumed by failed or weak memory cells. By discretely identifying addresses with weak bits, host 702-D can provide remapping or duplicate backup memory on its die. Referring now to FIG. 7E, a block diagram of line card 700-E with illustrated components having BBISTR, including the host and the memory chip and/or MCMs, and having an assembly level shared memory resource (SMR) is shown, according to one or more embodiments. Line card 700-E is similar to line card 700-D but with the addition of an assembly level shared memory resource (SMR) 708-E disposed in the data path between memories MEM 704-E0 and MCM 704-EP and host 702-E. SMR 708-E acts as a GBR of FIG. 5A to screen the outgoing data from memories to the host 702-E. Additionally, Host 702-E has a built in memory with BBISTR 703-E therein for its on-die cache.

Margined Testing

Figure 8:
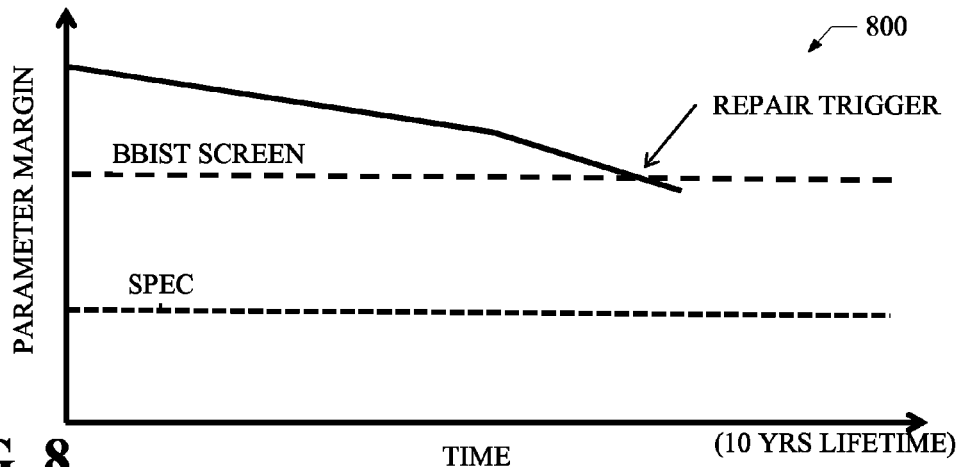
FIG. 8 is a graph illustrating a degradation of a memory cell intersecting a margined parameter level to identify a weak cell early during its expected lifetime, according to one or more embodiments.

Referring now to FIG. 8, a graph 800 illustrating a degradation of a memory cell intersecting a margined parameter level to identify a weak cell early during its expected lifetime is shown, according to one or more embodiments. BBIST screen level is a parameter margin that is above a specification level such that as a memory cell degrades over its lifetime, e.g., a ten-year life, it may cross the BBIST screen level as a weak memory cell and thus provide a margin of safety above the specification performance level. Any combination or permutation of one or more multiple adjustable parameters, such as those described for adjustable parameter block 540 in FIG. 5A, can be utilized to create the noted margin.

Flowchart of Methods

The following flowcharts illustrate the processes by which the aforementioned apparatus and concepts, from FIG. 2A through FIG. 8, are utilized to accomplish the goal of reliable data accesses. Oval shapes act as pointers to move from one flowchart to another and return back, with the name inside the oval indicating the action to be performed. The processes herein for tests, diagnosis, and repair exist for the memory cell itself as well as supporting and enabling circuits such as the word line driver, the bit line driver, the sense amp, etc. to the extent that they are provided on a granularity level associated with the test and the redundant memory.

Figure 9A:
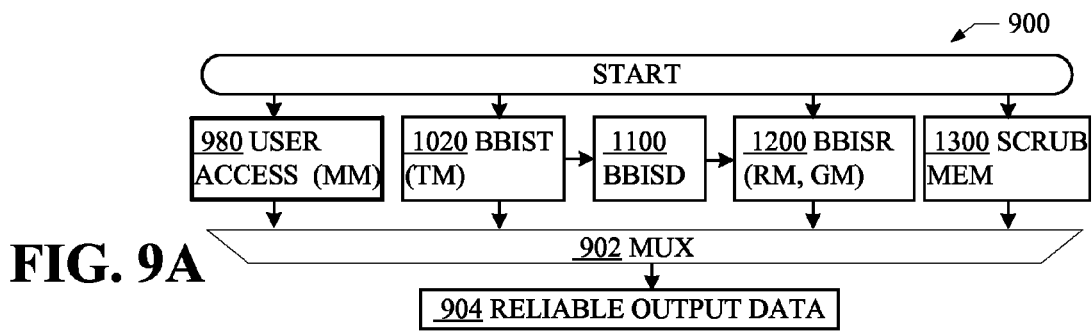
FIG. 9A is a flowchart illustrating the configurable operations of BBIST, BBISD, BBISR and scrub, occurring parallely in different locations in a resilient memory, according to one or more embodiments.

Referring now to FIG. 9A, a flowchart 900 illustrating the configurable operations of BBIST, BBISD, BBISR and scrub, occurring parallely in different locations in a memory is shown, according to one or more embodiments. In particular, after an initialization or start of a memory, the following functions can be performed in parallel for different portions of memory: user access 980 to main memory; BBIST 1020 on a target portion of main memory or redundant memory with associated access to its data in temporary memory (TM); BBISD 1100 and BBISR 1200 functions on data from repaired memory that is stored in RM and global bit replaced (GBR) memory (GM); and finally with scrubbing of memory 1300 occurring on memory that is not being accessed or tested. A mux 902 for selecting an appropriate one of the multiple data storage physical locations illustrated for the correct data value will provide a resultant reliable data output 904. Flowchart 980-1 in FIG. 9C illustrates the logic for identifying a physical location of data for an external access, given the noted test and repair processes that could be simultaneously operating in a given memory chip and given the multiple hierarchical locations of memory as MM, RM, TM, or GM in which the data might be stored.

Figure 9B:
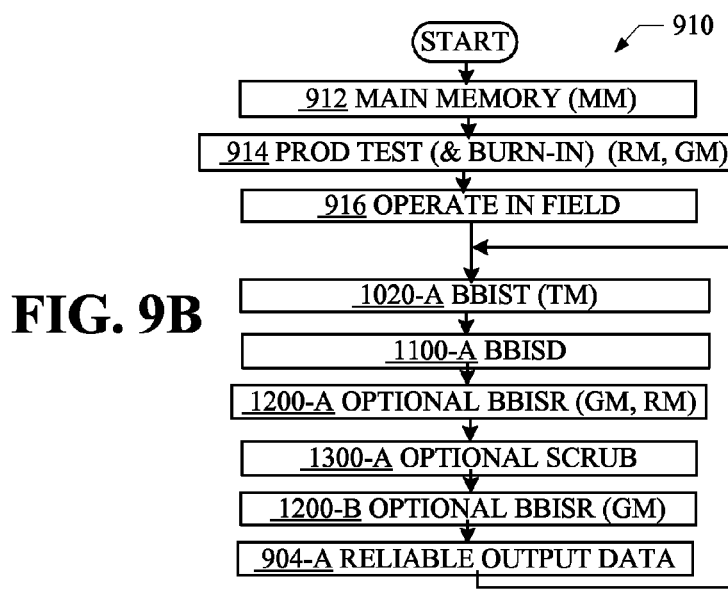
FIG. 9B is a flowchart illustrating the configurable operations of operations of BBIST, BBISD, BBISR and scrub, configurably occurring on an exemplary memory cell over time, according to one or more embodiments.

Referring now to FIG. 9B, a flowchart 910 illustrating the configurable operations of BBIST, BBISD, BBISR and scrub, configurably occurring on a given memory cell over time is shown, according to one or more embodiments. The given hypothetical memory cell located in main memory 912, first undergoes production test and burn-in operation 914 with potential repairs occurring in redundant memory (RM) and GM. Next, a memory cell is operated in the field in operation 916 with external accesses per FIG. 9C. A potential concurrent operation to given memory cell operating in the field is a BBIST 1020-A is that the given memory cell can be called on as a TMUT per FIGS. 9C and 10A-10C with storage of its data being forwarded to the TM. If a weakness or failure arises in the given memory cell, then it could undergo diagnostics from a BBISD 1100-A as described in FIG. 11, and possibly undergo repair from an optional BBISR 1200-A, as described in FIG. 12 with its data being stored in either GM or RM. Optional scrub operation 1300-A per FIG. 13 can also intermittently occur on given memory cell, when the given memory cell is not being accessed or tested. Optional BBISR 1200-B can be a global bit repair that occurs to the RM that replaced the given hypothetical memory cell in MM, if the RM itself had a failure and had to be replace by GM. Finally the data that is output in operation 904-A, from either the physical or virtual memory, for the given memory cell is reliable and trustworthy.

Figure 9C:
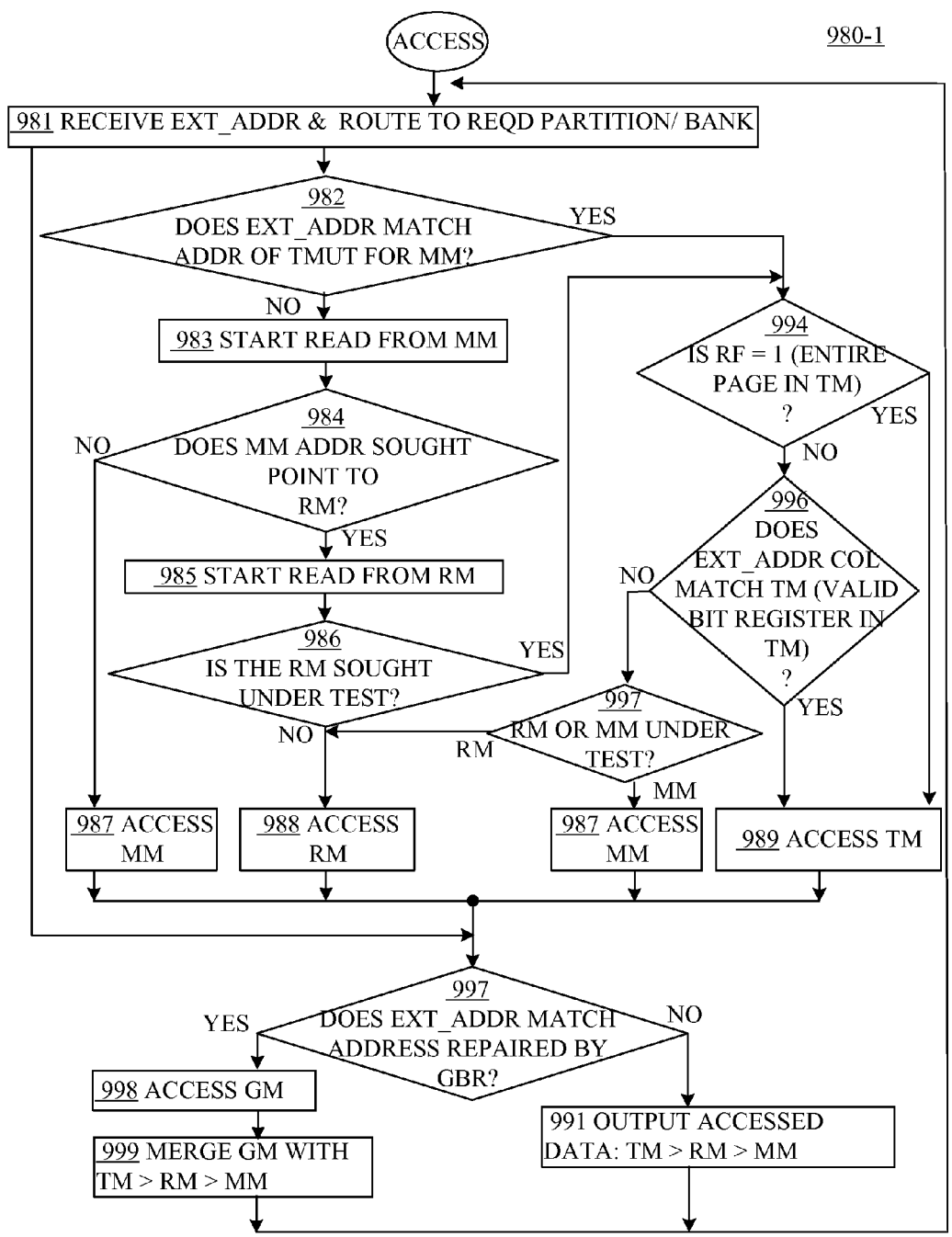
FIG. 9C is a flowchart for accessing different parts of physical or virtual memory in a memory device having BBIST and BBISR, according to one or more embodiments.

Referring now to FIG. 9C, a flowchart 980-1 for accessing different parts of physical or virtual memory in a memory device having BBIST and BBISR is shown, according to one or more embodiments. The access function flowchart 980-1 begins with an access request, whether internally generated for a BBIST or a scrubbing operation, or whether externally generated from a user, per operation 981. The request is routed to the appropriate partition and bank, assuming a partitioned and bank sectioned memory, such as the example provided in FIGS. 4 and 5. Several inquiries then occur, either in parallel for latency savings as in the present embodiment, or in a staggered or sequential manner.

For example, inquiry 982 determines whether the external address matches the address of the target memory under test (TMUT), as implemented in parallel comparator 306 in FIG. 3A. If the address sought is a section of memory under test, then inquiry 994 determines whether: i) the transition of data from the TMUT to the temporary memory (TM), in one word per free cycle pieces, has been completed, at which point the RF flag is set to 1; or ii) any portion of the data from TMUT is still in main memory (MM) for a redirect flag (RF) value, stored in register 352 of FIG. 3B, that is equal to 0. The affirmative response to inquiry 994, e.g., an RF=1, means that all the original data from the TMUT is in the TM, so the pointer simply points to TM. A negative response to inquiry 994, e.g., an RF=0, raises inquiry 996 as to whether the external address column has a valid bit checked in the same column of TM. A negative response to inquiry 996 indicates that the transition of the particular word in question from TMUT to the TM has not been completed, and thus, the physical location for the correct data bit needs to be determined by inquiry 997, that determines whether the TMUT is RM or MM. If RM, then RM access RM operation 988 arises. If MM, then access MM operation 987 arises. A positive response to inquiry 996 indicates that the transition of the particular word in question from TMUT to the TM has been completed, and thus, the physical location is in TM, which causes operation 989 to access TM. Note that while TM is being accessed for the data originally stored in TMUT, the TMUT itself is simultaneously undergoing test. Thus the TMUT physical memory is available for test, and the original, or updated data, from the TMUT is available for an internal or external access, with transparency and no or low latency to the user.

If the determination to inquiry 982 was negative, e.g., the external address did not match the address of the TMUT, then operation 983 starts to read data from MM. Next, inquiry 984 determines whether the MM itself is pointing to RM, e.g., from a previous production or in-field repair. If there are no pointers from MM to RM, then the data will be in MM, and operation 987 accesses MM. If, however, inquiry 984 determines that MM is pointing to RM, then operation 985 starts to read from RM, followed by an inquiry 986 as to whether the RM sought is under test. Again, this scenario arises where the MM is not under test, but when the MM points to a RM that might be under test. If the answer to 986 is affirmative, that the RM sought is under test, then the process proceeds to operation 994, as described above, to determine whether the TM has captured the original data from the RM yet. If the answer to inquiry 986 is negative, then the RM is not under test, and operation 988 accesses RM.

In parallel with inquiries 982, inquiry 997 determines whether the external address matches an address repaired by global bit redundancy (GBR) memory (GM). An affirmative response proceeds to operation 998 that accesses GM and either reads from, or writes to the GM address corresponding to the address sought by the external access. Thereafter, operation 999 applies a read operation where the GM data is merged with the TM, RM, or MM data read. For example, if MM received an external access, and word 3 of the desired wordline pointed to RM, which itself had a single erroneous bit in the word, then operations would merge, including the portion of MM that did not point to RM, the entire portion of RM pointed to, and the GM slated to replace the bad bit from the RM. A negative response from inquiry 997 proceeds to operation 991 that outputs the previously accessed data, whether from TM, RM or MM, in that sequence of priority, as noted in the prior operations. Following the outputs of 991 and 999, flowchart 980-1 returns to the beginning and awaits another access. The noted logic flow effectuates a redundant memory architecture that performs test and diagnostics. This flow also repairs the background of external accesses, and in particular one that also has a multi-tier hierarchical basis, e.g., MM, RM, TM, and GM, and/or one that also has multiple granularities, e.g., word×32 line block replacement granularity for RM and single bit replacement granularity for GM, and/or one that also has multiple degrees of proximity, e.g., RM as local redundant memory and GM as global redundant memory.

Referring now to FIGS. 10A and 10B, flowcharts 1020-1 and 1020-2 illustrating management operations of BBIST on memory is shown, according to one or more embodiments. Flowcharts 1020-1 and 1020-2 are one embodiment of BBIST 1020 of FIG. 9A and BBIST 1020-A 9B, managing the sequencing of the steps and the logic of performing the tests and calling on diagnostics and/or repair. Flowcharts 1020-1 and 1020-2 are implemented by BBISTM 350 of FIG. 3B or P-BBISTM 351 of FIG. 3C, where counter 353 and registers 352 track address progression, and the registers 352 or look up table (LUT) 354 provide the given test parameter and or value or selection, while logic 356 manages the interaction with the MAC 504-0 of FIG. 5A that executes the test operations on memory, and specifically the TMUT. An access that occurs at any point during the BBIST operations herein is handled by flowchart 980-1 in FIG. 9C.

BIST flowchart 1020-1 starts with either an external request 1021-A or an internal request 1021-B. The internal request 1021-B can be a default BIST regimen with a specified regular interval testing occurring at a given number of cycles, an elapse of time, an event such as an interrupt, initialization or shutdown, and/or any combination of these items. The external request 1021-A can be provided by the host at its own prerogative, occurring for any of the same factors in the host as mentioned for the internal request. The external request from host 1021-A can be received by the present IC to undergo test via a CMD or instruction in the normal data path, e.g., using GCI communication protocol, or using another port, e.g., a SPI port.

Operation 1024 selects the desired target memory in main memory (MM) for the BIST operations, referred to as the target memory under test (TMUT). The target memory size is the portion architected for isolation during the stressed parameter, such that the balance of memory is not affected by the out of specification parameter used for the TMUT. In the present embodiment, a single wordline, or page, that has multiple words, e.g., 16 words having 72 bits per word, is chosen as the TMUT, though the present disclosure is well suited to a wide range of portions of memory, e.g., isolating columns, words, or bits for test rather than rows.

The desired block can be selected using a wide range of methods, such as: sequentially based on address, proximately based on physical location in the memory or IC, priority based on frequency of uses, priority based on historical performance and past weak cell proclivity, external request, memory where high priority data is stored, etc. Once a target memory location is selected, operation 1026 sets the redirect flag (RF) to zero, then opportunistically starts to shadow copy the target memory under test (TMUT) to a temporary memory (TM) in portions. Opportunistic operations only occur during a free cycle, e.g., when the higher priority external accesses do not occur. The RF is used to manage the sequential and typically intermittent operation of copying memory out of the TMUT into the TM during free cycles. If the RF=0, then the data of the TMUT is split between the TMUT and the TM and an access to that data will have to examine the column address to determine with certainty whether the data is located in the TM or the TMUT. If the RF=1, as in operation 1028, then all the data has been copied of TMUT to the TM, and any external accesses to the data originally stored in TMUT will be redirected, or pointed, to the TM.

In operation 1030, one or more operational parameters for testing are selected. The tests to be run, and the sequence of those tests are provided for in logic such as logic 356 of FIG. 3B, as the lowest latency implementation. However, they can also be implemented using reconfigurable circuits, e.g., FPGA, or processor based implementation of code. Exemplary tests are implemented using adjustable or selectable circuitry, such as those shown in adjustable parameters block 540 of FIG. 5 that expose the memory under test to any applicable performance category desired such as stressed refresh period, cycle time, power supply voltage, bias voltage, sense voltage and times, slew rates, precharge voltage, precharge time, current rates, etc. Another test factor could be the operating temperature of the IC, provided by an internal or external sensor, or timed to a known worst condition, e.g., mid noon on summer on a weekday during ambient temperature and peak communication times. Optionally, programmable parameters and test schemes can be an input 1030-A from an external source to a programmable BBIST, such as P-BBISTM 351 shown in FIG. 3C. Once a test is selected, e.g., bias voltage, and a parameter level chosen, e.g., a five, ten, fifteen, etc. percent below-specification bias voltage, the process proceeds to the TEST operation routine, illustrated in FIG. 10C and described hereinafter. The test operations access or refresh the TMUT at the given stressed parameter and determine whether the TMUT passed or failed that test. After the test routine for the given stressed parameter is completed, the process of FIG. 10C returns, as shown by the dashed line between TEST and BBIST1, to FIG. 10A at oval BBIST1 which feeds back into operation 1030. This loop closes out that specific discrete test portion of a larger test regimen and thus proceeds to inquiry 1032. In an alternative embodiment, a failure in any stress test could jump directly to step 1036 and subsequently to pointer BBIST2, rather than continuing the test regimen to determine the full scope and performance of the memory cell across the full test regimen.

Inquiry 1032 determines whether the test regimen is complete. That is, a test regimen might consist of one to multiple discrete tests such as a lengthened refresh period, followed by a reduced bias voltage, followed by shortened sense amp timing, followed by a adjusted precharge voltage, or lengthened refresh period, etc. Two or more discrete tests can also be performed in combination, e.g., a lengthened refresh period in combination with a reduced bias voltage. The individual tests in the test regimen can be performed sequentially on a given TMUT before indexing a WL to the next TMUT, or alternatively all memory in a block can be tested for a first test, e.g., lengthened refresh period, and when complete all memory in the block can then be tested for the next test on a different stressed parameter, and so on. In one embodiment, a single failed test on the TMUT can end the BBIST test regimen and proceed to diagnostics and/or repair, e.g., test numbers one and two for low and high voltage pass, but test three for delayed refresh failed, then subsequent tests four through then subsequent tests four through ten either are discontinued, because of high traffic through memory, etc. However, in another embodiment, the full test regimen is completed prior to disposition of the TMUT. This is because test levels may be within specification limits, but pushed to an extreme range, or test levels may test corner conditions that are a combination of extreme range of multiple parameters for operating memory. In another case, the parameter levels are clearly outside the specification, and in those instances, a failure of any single test is more likely to end the test regimen and proceed to diagnostics and/or repair immediately.

A negative response to inquiry 1032 proceeds to operation 1034 that selects a new stressed parameter or a new margin for the prior stressed parameter and returns control to operation 1026. For example, if the completed test was for a reduced bias voltage of five percent under specification, then operation 1034 could either reduce the bias voltage further, e.g., to ten or fifteen percent, or could move on to a new test parameter, such as reduced cycle time. The specific tests, the parameter levels outside of specification, either high or low depending upon the parameter, the sequence order, and the specific combinations are all well suited to the present disclosure. In one embodiment these variables are hard coded as a default in the BBISTM 350, while in another embodiment, they are programmable, based on user input to P-BBISTM 351 described in FIGS. 3B-3C, and as previously described. If the response to inquiry 1032 is affirmative, then operation moves to 1036.

Inquiry 1036 determines whether any memory had errors from the test regimen. If a memory cell failed at least one stress test parameter, then the answer is affirmative, and operation proceeds to BBIST2 pointer for operations in FIG. 10B, described hereinafter. If the response to inquiry 1036 is negative, then operation 1038 sets the redirect flag (RF) to zero, and opportunistically restores data from the TM to the MM by shadow writing the data one word per cycle, as external access traffic permits. The RF flag setting at zero indicates that the data values are split between the TM and the MM, or RF in the case that part of the TMUT had a prior repair that pointed to RM. In operation 1039, after all the data is restored from TM to MM, or RM, then the TMUT address is removed from the table of memory under test, and is free from any repair requirements from the current test. Next, operation 1040 increments to the next portion of memory to be tested, e.g., per the counter block 353 incrementing the address from registers 352, per FIG. 3B, and returns to the top of flowchart 1020-1 at block 1026 to repeat the process until all memory to be tested, e.g., MM and/or RM, is completed using discrete tests and/or the full test regimen. Once all memory in the bank is tested to all desired tests, with any diagnosis or repair initiated and completed, if possible, the entire test process can either shut down and await a new BIST instruction or can start over from the beginning, until either a given number of cycles or a given period of time or a given event indicates a shutdown of the testing for the time being.

Referring now to FIG. 10B, the BBIST process continues per pointer BBIST2 from an affirmative response to inquiry 1036 of FIG. 10A. Operation 1042 inquires whether the memory under test was previously repaired, per a search of the addresses for the local redundant memory, e.g., stored in memory 439 of BISR engine 430 of FIG. 4, or in another embodiment of a memory or look up table such as centralized address storage table 220 of FIG. 2D, or in LUT 374 of FIG. 3F. The prior repair could be to a main memory that was repaired with local redundant memory, per production burn-in or per field BBISR, or it could be to a redundant memory that was repaired with another redundant memory, e.g., global redundant resource (GBR). If memory under test with a failure was not previously repaired, then operation 1046 inquires whether the TMUT is in RM or in MM. If in MM, then BBISD pointer initiates the diagnostic procedure on the MM address in question per FIG. 11. If the memory to be repaired is RM, then inquiry 1048 determines whether the RM is actively being used as redundant memory. If the RM is not being used, and is sitting idle, as a resource to use in the future, then operation 1049 will delist that portion of the RM that failed the test, based on the granularity of the replacement portions. In this way, the portions of RM available for repairing MM can have errors removed and be of high reliability, such that when they are called for a repair, there is certainty that the repair itself will not have an error. Following the delisting, pointer BBIST3 resumes the background testing at operation 1040. If the RM is actively being used as redundant memory, then operation 1050 will identify the physical address pointing to the RM, e.g., by making a dummy request to parts of the TMUT, and capturing, per operation 1052, the MM address from which a forwarding operation to the failed RM occurs. That MM address is then provided to the GBR for a GBR repair, and diagnostics operations continue per the BBISD pointer. If the IC is operated as a BBIST function only, without BBISD or BBISR, then in lieu of BBIST2 pointer proceeding to operation 1042, BBIST2 would point to an operation (not shown) of reporting the error results to the host.

A request for a BBIST can arise from sources outside of the normal continuous BBIST test sequence. For example, an error detected in an EDC background test can prompt a BBIST on the failed memory address. Alternately, an external request from a host that detects a pattern of erroneous bits, can flag a given memory address for the BBIST to test. The present disclosure can accommodate these interrupts in the normally queued and sequential BBIST operation either by an interrupt, where the existing BBIST operation gracefully exits after completion of the present test and restoration of data to the TMUT, or by a queue of special requested tests, that can checked and accessed in a periodic time or event, such as the completed cycle of sequential BBIST through a memory block. A similar protocol can be used for external requests for repair in FIG. 12.

Referring now to FIG. 10C, a flowchart 1060 illustrating the operation of the test portion of BBIST on memory is shown, according to one or more embodiments. The test operation of flowchart 1060 arises per operation 1030 of FIG. 10A, which can be any of the adjustable or selectable parameters described therein, or combinations thereof. Alternatively, a non-stressed operation of memory can also be performed to confirm in-specification performance with stressed test performance. Operation 1062 inquires whether the test desired is related to refresh. For a multi-parameter test, this inquiry is for the first parameter of the list to be tested. A negative result, e.g., for test parameter not related to refresh, proceeds to operation 1074. In operation 1074, if the parameter to be tested is write-based, then the parameter related to the write is adjusted to the margin levels, and a test pattern is opportunistically written into TMUT physical cells per operation 1076. In one embodiment, the only parameter tested in this portion of the test regimen is a write-based parameter. The test pattern in one embodiment, cycles between a repeating patter of an "A" [1010] and a "5" [0101] to toggle every bit and to have every other bit a different value. Thus, a rail-to-rail voltage swing to specification limits is seen by the cells to these two cycles. Even if the TMUT was previously repaired in production or prior BBISR, the physical memory cell of the TMUT is tested. If the test is not a write-based test, then the test pattern is written into TMUT using specification parameters. In operation 1077 if the test is a read-based test, then the parameter related to the read is adjusted to the margin levels. Note that it is possible in one embodiment, to have a write-based test in combination with a read-based test to test a corner-case of the parameters.

Inquiry 1078 determines whether to combine a read and/or write test with a refresh test. An affirmative response moves to operation 1062 that asks, for the second time, if a refresh related test is now part of the test. The second pass at operation 1062 allows the read and write portions of the test to be setup prior to the refresh portion of the test. Whether on the first or second pass, an affirmative response to operation 1062 proceeds to operation 1064.

Operation 1064 opportunistically writes the test pattern into the entire memory under test, e.g., the test pattern previously mentioned is written into the entire word line in the present embodiment. Operation 1066 turns off the refresh. As illustrated in FIG. 5C, an enable from the BBISTM 350 or P-BBISTM 351 is withheld when the refresh circuit reaches the TMUT WL as it sequences trough successive wordlines of memory. In operation 1067, the refresh is withheld for a desired amount of time or cycles. The quantity of cycles the refresh operation is skipped for the TMUT is determined by the severity of the test, per the limits and settings provided in the default design in logic 356 or as programmed in by a user into configuration registers 357 or parameter registers 358. Thus, if a refresh is not enabled for each of B successive cycles through memory, then the TMUT is experiencing a refresh stress test that is B times the normal specification. As such, voltage leakage, by a marginal bit, can be detected due to the prolonged retention period. For example, the memory block includes a capacitor with a pass gate transistor. A bit error is detected when the voltage leaks out of the capacitor when the gate is turned off. Operation 1068 turns the refresh back on and refreshes the TMUT. Whatever logic level the memory cell kept or did not keep will now be maintained through specification level refreshes.

After operations 1078 for read/write tests and/or after operation 1068 for refresh test, the method proceeds to operation 1082 where data is read from the TMUT. Operation 1084 then compares the resultantly read data to the test pattern, e.g., using comparator 355 of FIG. 3B or 3C. Because the test pattern is deterministic, all bit errors can be located in the TMUT, regardless of the quantity, and even if every single bit has an error. Inquiry 1086 then determines whether the TMUT has any errors for the modified parameters under which it was tested. A negative response, indicating no errors, then proceeds to pointer BBIST1 that returns operation to block 1030 in FIG. 10A, thus completing that test portion of the test regimen. An affirmative response to inquiry 1086 proceeds to operation 1088, where the error is noted for the given parameter and the TMUT, e.g., in registers 352 of FIG. 3B or 3C, and operation proceeds to pointer BBIST1 that returns operation to block 1030 in FIG. 10A, so the test results can be evaluated.

Referring now to FIG. 11, a flowchart 1100-1 illustrating the operation of BBISD on memory is shown, according to one or more embodiments. Diagnostics is an implied process that occurs with the BBIST, but it is optional and the logic and instructions to perform diagnostics does not have to be included in some embodiments of the present disclosure. Diagnostics methods begin by being forwarded from another part of the test process, e.g., from BBIST operations 1046 and 1052 in FIG. 10B. Operation 1102 evaluates the failure or weakness provided by the test operations in terms of input factors such as: rate of degradation, factor of margin, type of parameter not met, quantity of parameters not met, resources available, projected resource consumption rate, FMEA for cause, a pattern or grouping in time/proximity/layout/external source/etc. For example, a pattern similar to infant mortality, occurring on ICs with low hours of burn in or field operation, or to bit degradation, can provide different responses to what repairs should be done, or the projected lifetime of the IC. One of the purposes of the BBIST and BBISD is to provide early warning to a user that a part may fail sometime in the future, not in the present. The evaluation of the failures or weaknesses can also be provided externally by communicating the failure results out to a host or another IC capable of analysis that is more sophisticated. Operation 1102 is implemented by logic 365 in BBISD 350 and 365-1 in P-BBISD 351 of FIGS. 3D and 3E that can retrieve data on frequency of failures from counter in BBIST counter 353, and evaluate the address groupings by sorting failures per different address locations, e.g., module-basis, column-basis, WL-basis, etc.

After the diagnosis, inquiry 1109 determines whether there are sufficient resources for the expected lifespan of the part. If there are insufficient resources for the lifespan of the part, then operation 1111 provides a service report to the user noting that the part is currently operating, but that it is predicted to not satisfy its lifespan and optionally provide a quantitative status of redundant memory and/or expected lifetime. The details of this report can be designed into BBISD per the application. After operation 1111, and after an affirmative response to inquiry 1109, the process proceeds to pointer BBISR for repair operations according to FIG. 12.

Sufficient resources for lifespan can be defined as sufficient resources for a projected amount of time of failures at the given rate, and/or at a predicted rate. Thus, if 80% of memory resources allocated for field repairs are consumed at 500 hours, then a failure of the IC as a whole is likely to occur prior to the expected lifetime of the IC. The specific failure threshold for consumed redundant memory, whether local redundant memory or the global bit redundant memory, is determined on a design basis and on empirical and test data for the chip, to provide the user with sufficient time for preventative maintenance replacement of the part. This is a balance between the user receiving a reasonable amount of usage from the chip, and the user not being jeopardized by an early nuisance or catastrophic failure that might affect the reliability of the line card and/or system. These thresholds and values can be provided as a default value on the chip for BBISD 360, or can be updated externally by a user for the programmable BBISD 361, of FIG. 3D.

The diagnosis procedure above can benefit from identifying patters from typical failure modes and effects analysis (FMEA). They can be utilized to diagnose the failures reported by BIST and communicated to the BBISDM and optionally to the user. Among the most frequent failure modes for an embedded DRAM memory are the following six examples. A first failure mode is a MIM-to-MIM leakage caused by the TDDB (time-dependent dielectric breakdown) mechanism. This is mainly due to a weak spot that exists because of processing defects forming during CMP of the crown layer or during the cleaning of the formed crown before the first electrode deposition. The weak spot may not manifest itself for a long time but eventually it becomes leaky under the electrical stress formed by the different data stored in the neighboring cells. Consequently, stress tests that ensure opposite bit values in adjacent memory cells, along with an extended refresh period could help manifest the MIM-to-MIM leakage failure mode. A second type of failure is a TDDB of the gate oxide. This includes the gate oxide of the pass-gate and logic transistors. A third type of failure is a threshold voltage (VT) shift of transistors, particularly that of sense amps and pass gates. This failure occurs primarily when the sense-amp VT gets higher due to electron trapping in the gate oxide of sense-amp n-MOSFET, its headroom for sensing gets smaller and requires longer time to sense. When combined with a weak cell, the sense amp may fail to sense the data correctly within the given time for reading. The VT shift of a transistor failure occurs secondarily when the pass-gate VT decreases due to electron trapping in the gate oxide of the p-MOS pass-gate, the channel leakage (when unselected) increases and the bit-line signal may disturb the stored data. A fourth type of failure is electromigration, especially through contacts and vias. A fifth example of a failure mode is the hot-carrier effect, in which the leakage and performance of transistors is degraded over time. A sixth and final example of a failure mode is a general defect, or contamination, either in the original wafer or introduced during the processing that results in a change in characteristics over time. Utilizing this failure mode information on a chip in the field, will help identify the environment that a replacement chip might experience, and the characteristics that the replacement chip should have, as well as provide insight to future generations of chips to overcome these failures. If a separate diagnostics process and apparatus are not utilized, then operations 1046 and 1052 in FIG. 10B would point to BBISR in lieu of BBISD.

Figure 12:
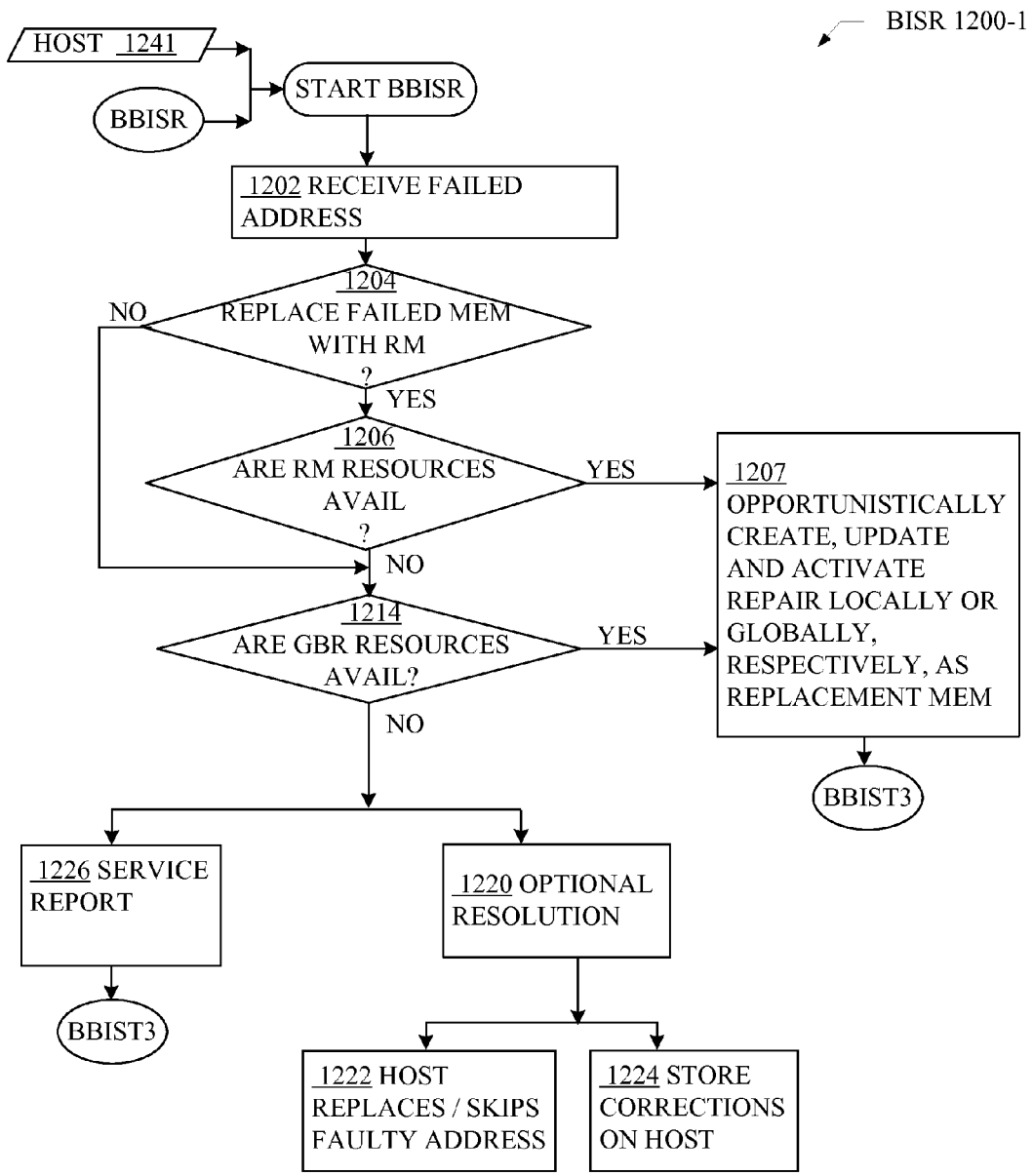
FIG. 12 is a flowchart illustrating the operation of BBISR, according to one or more embodiments.

Referring now to FIG. 12, a flowchart 1200-1 illustrating the operation of BBISR is shown, according to one or more embodiments. The BBISR process can be initiated by either the host 1241, via a command or instruction in the communication link, such as GCI, or by a dedicated link such as a SPI port. The BBISR process can also be initiated internal to the chip by pointer BBISR originating from BBISD per FIG. 11. The BBISR process begins with operation 1202 receiving a failed address, e.g., as forwarded from the BBIST or BBISD process. Inquiry 1204 determines whether the failed memory is to be replaced with local redundant memory, which in the present embodiment replaces a block of memory equivalent to one word in width, which is 72 bits, and one-half module in depth, which is 16 lines. The default value for this inquiry can be set in production or by the user, e.g., for in-field repairs GBR is favored in one application rather than a local redundant memory block. The decision can depend on inputs such as historical failure modes and the best manner to repair them, and such as granularity of the failure, e.g., GBR single-bit resolution is better for an isolated, single memory cell failure, etc. For an affirmative response, inquiry 1206 next determines whether redundant memory resources are available. If they are available, then operation 1207 opportunistically creates, updates and activates the repair on local redundant, or replacement, memory. If RM resources are not available, then operation 1214 inquires whether a second type of redundant memory is available, in particular, the global bit redundancy memory. IF GBR memory is available, then operation 1207 again opportunistically creates, updates and activates the repair, but this time for the global bit resource redundant memory (GM).

Following operation 1207, BBIST3 pointer returns to FIG. 10A, operation 1040 that increments to the next portion of memory to be tested, as the current repair has been accomplished. A negative response to inquiry 1214 means that all redundant memory resources have been consumed or are not available, e.g., they have errors themselves, and operation 12256 provides a service report to the user, followed by returning to BBIST operation 1040 in FIG. 10A per pointer BBIST3. Operation 1040 indexes the portion of memory to be tested and continues the BBIST operations. This is because even if there are insufficient resources to repair the IC, finding and reporting errors to the user/host still has value, e.g., the host can map around the errors, continue to monitor degradation, etc. In parallel with operation 1226, optional operation 1220 can allow to the host to either replace or skip the faulty address, per operation 1222, or to have the host store the information related to the failed bit and perform corrections themselves per operation 1224. If the memory IC can identify every bad bit(s) in a word or WL, then providing that information to the host allows the host to implement the correction because they would know the specific bit that was bad. In one embodiment, IC is operated with no BBIST and no BBISD, but only BBISR. The background EDC check and memory scrub can also be optionally inactive. In this scenario, the IC would still be available to receive error detection and correcting from the host. If the host is running EDC then the host can identify the errors and specify the repairs needed, especially if the repair mechanisms and options are provided to the hose for an intelligent selection.

Figure 13:
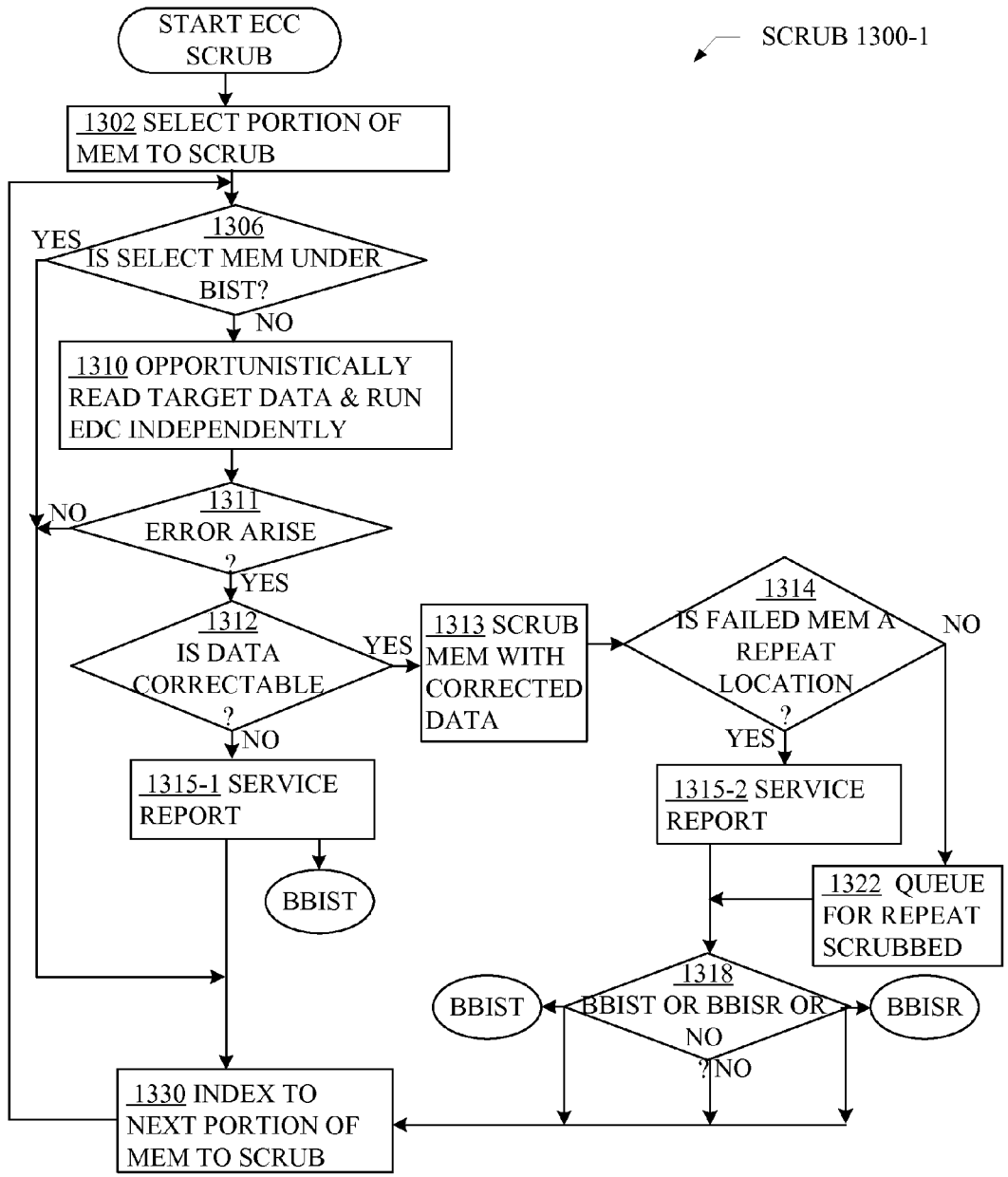
FIG. 13 is a flowchart illustrating a scrub operation of memory using ECC, according to one or more embodiments.

Referring now to FIG. 13, a flowchart 1300-1 illustrating a scrub operation of memory using ECC is shown, according to one or more embodiments. Operating an error correction code on memory not in use, and any related scrubbing, can be performed in the background at any time, either run continuously, at either predetermined intervals or event occurrences, such as initialization or when an error is detected by BBIST, or at the request of the host. Operation 1032 selects a portion of the memory to perform EDC, whether in MM or RM, and optionally whether in TM or GM. Operation 1306 inquires whether the selected portion of memory is presently undergoing BBIST. If it is undergoing BBIST, then the process proceeds to operation 1330 that indexes to the next portion of memory to test. If it is not undergoing BBIST, then the memory is free to opportunistically read target data and run EDC per operation 1310. In operation 1311, an inquiry determines whether an error has arisen. If no error, then process proceeds to operation 1330 that indexes to the next portion of memory to test. If an error does arise, then operation 1312 inquires whether the data is correctible. If the data is not correctible, e.g., there are two or more bad bits in the data string that render the identity of the bits indeterminate, then a service report is provided to the user per operation 1315-1, which notices the user of the failed data and the indeterminant bits, such that the host can optionally perform remedial measures in parallel. Additionally, the noted address with the failure, is provided to BBIST for evaluation in FIG. 10A per pointer BBIST. The BBIST test can identify any quantity of bad bits of data, if the error can be reproduced. After passing the address to BBIST, the background scrubbing process continues to operation 1330 that indexes to the next portion of memory to test. Thus, while the failed address during the EDC check is being tested and possibly repaired, the EDC background test is continuing on subsequent memory addresses. If data is correctible per operation 1312, then operation 1313 scrubs memory with the corrected data, such that if a user were to access that memory, it would receive corrected data. This reduces the possibility that the user might receive data with two bad bits that it would not be able to correct.

In operation 1314, an inquiry determines whether the failed memory cell is a repeat location. If it is a new location and not a repeat location, then operation 1322 queues the address for a repeat scrub at an interval that is shorter than the balance of memory that has not had a first failure. Recording the address also allows the process to identify repeat failures. If the error is a repeat location, then operation 1315-2 provides a service report to the user such that the user can also monitor that address, or optionally take remedial action themselves. One possible root cause could be a cell or sense amp that fails due to a phenomenon known as variable retention time (VRT) or Random Telegraph Noise (RTN). This results in changing characteristics over time, with the characteristics going between two or more states at random times. A repeat error found by scrubbing could be due to a memory cell that sometimes goes into a 'bad' state that results in a failure. The notice from 1315-2 is not as serious as the notice from 1315-1 because the failure in 1315-1 is recoverable using EDC. Operation 1318 inquires whether the faulty memory cell(s) should be tested or repaired. If memory is to be tested, then pointer BBIST directs the faulty memory address to operation 1024 in FIG. 10A. If memory is to be repaired, then pointer BBISR directs the faulty memory address to operation 1202 in FIG. 12. If neither BBISR or BBIST is chosen per inquiry 1318, then the memory will neither be tested nor repaired, but instead, will be retested, e.g., in a case where another cause of the error is suspected, such as a discovered voltage spike, etc. A repeat location for errors is more likely to defer to a BBISR over a BBIST. Optionally tying in diagnostics operations per FIG. 11 can assist with these decisions. Regardless of the outcome from inquiry 1318, the process proceeds to operation 1330 that indexes to the next portion of memory to continue testing.

FMEA

Figure 14A:
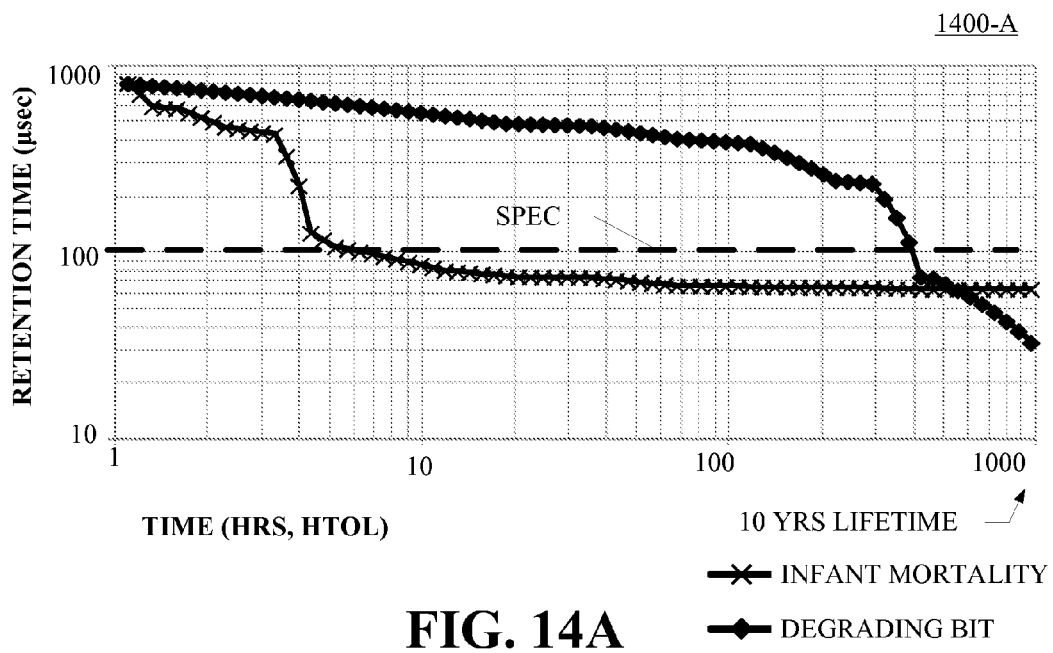
FIG. 14A is a log-log graph of a memory IC without repair features that fails to meet its life expectancy due to failures from infant mortality and from degrading bits, according to one or more embodiments.

Referring now to FIG. 14A, a log-log graph 1400-A of a memory IC without repair features that fails to meet its life expectancy due to failures from infant mortality and from degrading bits is shown, according to one or more embodiments. In the example illustration, infant mortality retention time drops off quickly, within the first four hours of high temperature operation life (HTOL), falling below specification requirement of 100 microseconds (μsec) at about six hours of HTOL, and then flattens out through the rest of the expected lifespan of the chip. In contrast, the degrading bit performance has a much flatter curve through about 120 hours of HTOL, after which its slope steepens and drops below specification requirement of 100 μsec at about 400 hours of HTOL.

Figure 14B:
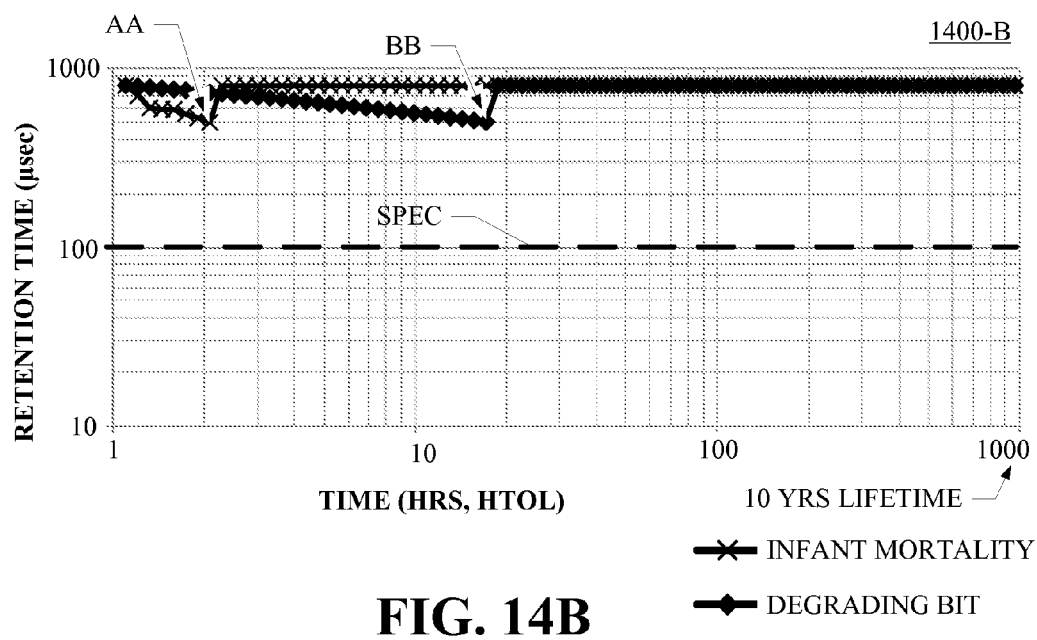
FIG. 14B is a log-log graph of a memory IC with BBIST, BBISD, and BBISR that meets its life expectancy by background testing and repairing failures of infant mortality and degrading bits, according to one or more embodiments.

Referring now to FIG. 14B, a log-log graph 1400-B of a memory IC with BBIST, BBISD, and BBISR that meets its life expectancy by background testing and repairing failures of infant mortality and degrading bits is shown, according to one or more embodiments. The present IC does have an infant mortality incidence and a degrading bit incident, where both have dropping retention times, a sign of a weak or failing cell. However, the BBIST detected these performance degradations, e.g., by increasing the refresh period and stress testing the memory cells. In the present example, at point AA the infant mortality degradation is identified, while at point BB, the degrading bit performance drop is identified. Repairs to both of these cells, by replacing them with good memory cells with near 1000 μsec retention times, is illustrated by the curve returning back up close to 1000 μsec and remaining flat through the expected accelerated HTOL of 1000 hours that corresponds to 10 year IC lifespan.

The present description provides for BBIST, BBISD, and/or BBISR in a programmable and non-programmable configuration that is agnostic of interface type, memory cell construction or type, manufacturing process, etc.

Methods and operations described herein can be in different sequences than the exemplary ones described herein, e.g., in a different order. Thus, one or more additional new operations may be inserted within the existing operations or one or more operations may be abbreviated or eliminated, according to a given application.

Other features of the present embodiments will be apparent from the accompanying drawings and from the detailed description. In addition, it will be appreciated that the various operations, processes, and methods disclosed herein may be carried out, at least in part, by processors and electrical user interface controls under the control of computer readable and computer executable instructions stored on a computer-usable storage medium. The computer readable and computer executable instructions reside, for example, in data storage features such as computer usable volatile and non-volatile memory and are non-transitory. However, the non-transitory computer readable and computer executable instructions may reside in any type of computer-usable storage medium.

The foregoing descriptions of specific embodiments of the present disclosure have been presented for purposes of illustration and description. They are not intended to be exhaustive or to limit the invention to the precise forms disclosed. Many modifications and variations are possible in light of the above teaching without departing from the broader spirit and scope of the various embodiments. The embodiments were chosen and described in order to explain the principles of the invention and its practical application best and thereby to enable others skilled in the art to best utilize the invention and various embodiments with various modifications as are suited to the particular use contemplated. It should be appreciated that embodiments, as described herein, can be utilized or implemented alone or in combination with one another. While the present invention has been described in particular embodiments, it should be appreciated that the present invention should not be construed as limited by such embodiments, but rather construed according to the claims appended hereto and their equivalents.

We claim:

1. An integrated circuit device (IC) comprising:
a main memory comprising a plurality of memory cells;
a temporary memory;
a background built-in self-test module (BBISTM) configured to select a portion of the main memory as a target memory under test (TMUT), to cache data from the TMUT into the temporary memory, and to apply a test to the TMUT; and
an arbiter coupled to the main memory and the BBISTM, the arbiter configured to provide access to the temporary memory when an external access points to the TMUT, and to provide access to the main memory when the external access points to an address in main memory other than the TMUT; and
wherein the BBISTM is operational simultaneously while the IC is operational for performing external accesses during field operation.

2. The IC of claim 1 further comprising:
a memory access controller (MAC); and
wherein:
the BBISTM performs BIST operations;
the MAC performs an external accesses; and
the BIST operations and the external accesses are interleaved.

3. The IC of claim 2 wherein the BBISTM performs BIST operations on the main memory while the MAC performs external accesses to the main memory during field operation.

4. The IC of claim 3 wherein the BBISTM performs BIST operations in parallel with the MAC performing external access.

5. The IC of claim 3, wherein the BIST operations are interleaved with the memory accesses.

6. The IC of claim 1, further comprising:
a redundant memory coupled to the main memory, the redundant memory for repairing the main memory during production testing.

7. The IC of claim 6 wherein:
the redundant memory is coupled to the BBISTM; and
the BBISTM is operational simultaneously while the IC is operational for performing external accesses in the field operation to redundant memory.

8. The IC of claim 6 wherein:
the BBISTM is operational for performing BIST operations on redundant memory in parallel to MAC performing external accesses to main memory or to temporary memory.

9. The IC of claim 6 further comprising:
a map table coupled to the arbiter, the map table for storing addresses of the TMUT and the redundant memory for comparison to an address of an external access.

10. The IC of claim 6 further comprising:
a background built-in self-repair module (BBISRM) configured to repair a portion of the TMUT by:
storing the cached data for the portion of the TMUT into a selected portion of the redundant memory; and
mapping a memory address of the portion of the TMUT to the selected portion of the redundant memory.

11. The IC of claim 10, wherein the arbiter is configured to:
receive a write or a read access memory request with a memory address; and
perform the write or the read access to the redundant memory if the memory address of the access memory request matches the repaired portion of the TMUT that were mapped to the portion of the redundant memory.

12. The IC of claim 10, further comprising:
a global bit registry (GBR), wherein the BBISTM is further configured to:
identify a weak bit of the TMUT that is susceptible to a spurious data error;
write the memory address of the TMUT into the GBR as a global memory address;
write a bit identifier of the weak bit of the global memory address into the GBR; and write a correct bit value of the weak bit into the GBR so that the bit identifier of the weak bit and the correct bit value of the weak bit are associated with the global memory address.

13. The IC of claim 12, wherein the arbiter is configured to:
receive a read access memory request including a memory address;
access data from the main memory or the redundant memory based on the memory address of the read access request; and
update a bit value of the accessed data as indicated by the bit identifier and the correct bit value associated with the global memory address in the GBR if the memory address of the access memory request matches the global memory address stored in the GBR.

14. The IC of claim 12, wherein the arbiter is configured to:
receive a write access memory request including a memory address and data;
write the data from the write access memory request to the main memory or to the redundant memory based on the memory address of the write access request; and
update the correct bit value associated with the global memory address in the GBR with a bit value of a corresponding data bit from the write access memory request, if the memory address of the write access memory request matches the global memory address stored in the GBR.

15. The IC of claim 10, wherein:
a latency for access to cached data in the temporary memory is less than or equal to a latency for access to data contained in the main memory.

16. The IC of claim 10, wherein:
the TMUT includes a check bit, and wherein the BBISRM is further configured to detect and correct a memory cell in the TMUT having a single data bit error.

17. The IC of claim 10, wherein the arbiter is configured to:
receive a write access memory request including a memory address; and
write data of the write access memory request to the selected portion of the redundant memory if the memory address of the write access memory request matches the memory address mapped to the selected portion of the redundant memory.

18. The IC of claim 10, wherein the arbiter configured to:
receive a read access memory request including a memory address; and
read data from the selected portion of the redundant memory if the memory address of the write access memory request matches the memory address mapped to the selected portion of the redundant memory.

19. The IC of claim 1, wherein:
the temporary memory has a first memory construction or type, and the main memory has a second memory construction or type, wherein the first memory construction or type is less susceptible to a single bit data error than the second memory construction or type.

20. The IC of claim 1, wherein:
the temporary memory is a type of memory selected from a group of memory types consisting of: a static random access memory, latches, and flip flops for storing the cached data.

21. The IC of claim 1, wherein:
the main memory has an architecture that provides selectability of the portion of memory as a wordline or column.

22. The IC of claim 1, wherein the TMUT includes a check bit and wherein the BBISTM is further configured to detect and correct a single data bit error in data contained in the TMUT based on the check bit.

23. The IC of claim 1, further comprising:
a background built-in self-diagnostics module (BBISDM) configured to determine whether the TMUT is to be replaced.

24. The IC of claim 1, wherein:
the integrated circuit device is chosen from a group of ICs consisting of: a processor, a co-processor, a microcontroller, an embedded processor, a field programmable logic device (FPGA), a programmable logic device (PLD), a level two cache, a System on a Chip (SoC), a multi-processor, and a multi-processor SoC.

25. The IC of claim 1, wherein the IC further comprises:
a linear feedback shift register (LFSR) for performing error detection and correction (EDC) on an error correction code (ECC); and
memory cells for storing ECC.

26. The IC of claim 1, wherein the IC is contained in a memory module.

27. An IC comprising:
a main memory comprising a plurality of memory cells;
a temporary memory;
a background built-in self-test module (BBISTM) configured to select a portion of the main memory as the target memory under test (TMUT), to cache data from the TMUT into the temporary memory, and to apply a test to the TMUT; and wherein:
the BBISTM is operational simultaneously while the IC is operational for performing external accesses during field operation; and
a latency for access to cached data in the temporary memory is less than or equal to a latency for access to data contained in the main memory.

28. The IC of claim 27 wherein:
the main memory is partitioned into a plurality of memory partitions, with each of the plurality of memory partitions having a dedicated temporary memory and a dedicated BBISTM coupled to each other; and
the BBISTM in each of the plurality of memory partitions can perform BIST operations in parallel with each other.

29. The IC of claim 28 wherein at least a portion of a BIST operation in at least two of the plurality of memory partitions is performed in parallel.

30. The IC of claim 27, further comprising:
a communication link for communicating with a host, wherein the IC can be configured by the host via the communication link to perform BBIST at the discretion of the host.

31. An IC comprising:
a main memory comprising a plurality of memory cells;
a temporary memory;
a background built-in self-test module (BBISTM) configured to select a portion of the main memory as the target memory under test (TMUT), to cache data from the TMUT into the temporary memory, and to apply a test to the TMUT; and
wherein the BBISTM is operational simultaneously while the IC is operational for performing external accesses during field operation; and
wherein the BBISTM is further configured to apply the test in parallel with the IC providing access to the temporary memory.

32. The IC of claim 31, further comprising:
access circuitry coupled to the main memory, the access circuitry having adjustable or selectable performance levels for use in stress testing the TMUT.

33. The IC of claim 32 wherein:
the access circuitry having adjustable or selectable performance level is selected from a group of adjustable or selectable circuits consisting of: an adjustable or selectable timer; an adjustable or selectable sense amp; an adjustable or selectable delay locked loop (DLL); an adjustable or selectable bias voltage; an adjustable or selectable current pump; and an adjustable or selectable power supply.

34. The IC of claim 32 further comprising:
at least one sensor coupled to the BBISTM, the sensor for providing performance or operating conditions for use in BIST.

35. An IC comprising:
a main memory comprising a plurality of memory cells;
a temporary memory;
a background built-in self-test module (BBISTM) configured to select a portion of the main memory as a target memory under test (TMUT), to cache data from the TMUT into the temporary memory, and to apply a test to the TMUT; and
wherein the BBISTM is operational simultaneously while the IC is operational for performing external accesses during field operation;
wherein the main memory is distributed into a plurality of memory partitions; and
wherein each of the memory partition has a dedicated temporary memory and a dedicated BBISTM coupled to each other for performing BIST.

36. The IC of claim 35, further comprising:
a redundant memory coupled to the main memory, the redundant memory for repairing the main memory during production testing;
a background built-in self-repair module (BBISRM) configured to repair a portion of the TMUT by storing the cached data for the portion of the TMUT into a selected portion of the redundant memory, and mapping a memory address of the portion of the TMUT to the selected portion of the redundant memory.

37. A method of testing a memory of an integrated circuit (IC) device, the method comprising:
selecting a portion of the memory as a target memory under test (TMUT);
operating a test on the TMUT;
operating at least a portion of the memory outside of the test;
caching data from the TMUT into a temporary memory; and
accessing data for the at least a portion of the memory outside of the test; and wherein:
operating the test on the TMUT is performed by a background built-in self-test module (BBISTM);
a latency for an access to cached data in the temporary memory is less than or equal to a latency for an access to data contained in the memory; and
the operating of the test and the operating at least a portion of the memory outside of the test occur at approximately the same time.

38. The method of claim 37 wherein:
the operating of the test and the operating at least the portion of the memory outside of the test occur simultaneously.

39. The method of claim 37 wherein:
the operating of the test is interleaved with the operating at least the portion of the memory outside of the test.

40. The method of claim 37 wherein:
the operating of at least the portion of the memory outside of the test is for an internal or an external access not associated with the test on the TMUT.

41. The method of claim 37 wherein:
the operating of the test on the TMUT is performed with at least one parameter having a first value; and
the operating of at least the portion of the memory outside of the test is performed with the at least one parameter having a second value; and
the first value is different than the second value.

42. The method of claim 41 wherein:
the first value is at an extreme limit of the specification range; and
the second value is at a nominal setting within the specification range.

43. The method of claim 41 wherein:
the first value is outside of a nominal setting within the specification range; and
the second value is at a nominal setting within the specification range.

44. The method of claim 41 wherein:
the first value is outside of the specification range; and
the second value is within for the specification range.

45. The method of claim 37 wherein:
the operating of the test on the TMUT is performed with a plurality of parameters such that each parameter of the plurality of parameters has a respective first value;
the operating of at least the portion of the memory outside of the test is performed with the plurality of parameters such that each parameter of the plurality of parameters has a respective second value; and
the first value of each parameter of the plurality of parameters is different than the second value of the parameter.

46. The method of claim 45, wherein the plurality of parameters define a PVT corner for an integrated circuit die including the memory.

47. The method of claim 45 wherein;
the at least one parameter is chosen from a group of parameters consisting of: refresh period, cycle time, power supply voltage, bias voltage, sense voltage, sense time, slew rates, precharge voltage, precharge time, current rate; and any combination of these parameters.

48. The method of claim 37, wherein:
the operating of the test on the TMUT occurs when the memory is operational for external accesses in field operation.

49. The method of claim 48 wherein:
the access to cached data in the temporary memory and the test of the TMUT occur at approximately the same time.

50. The method of claim 48, wherein the BBISTM performs BIST operations in parallel with each other.

51. The method of claim 37, further comprising:
repairing the memory during production testing of the memory by using a redundant memory coupled to the memory.

52. The method of claim 37, wherein the selected portion of the memory as the TMUT includes a check bit, the method further comprising:
detecting a single data bit error in the data contained in the TMUT; and
correcting the signal data bit error in the data contained in the TMUT.

53. The method of claim 37, further comprising:
remapping a memory address of the selected portion of the memory used for TMUT to a memory address of the temporary memory;

receiving a memory access request including a memory address;

determining if the memory address of the memory access request matches the memory address of the TMUT; and accessing the cached data from the temporary memory if the memory address of the memory request matches the memory address of the TMUT, the accessing occurring simultaneously during operation of the test on the TMUT.

54. The method of claim 51, further comprising:

performing a test on the TMUT simultaneously with accessing data in the redundant memory.

55. The method of claim 37 further comprising:

determining if at least a portion of the TMUT is to be replaced; and repairing the at least a portion of the TMUT by storing the cached data into a selected portion of a redundant memory, and mapping a memory address of the at least a portion of the TMUT to the selected portion of the redundant memory.

56. The method of claim 55, further comprising:

receiving a write access memory request including a memory address; and writing data of the write access memory request to the selected portion of the redundant memory if the memory address of the write access memory request matches the memory address mapped to the selected portion of the redundant memory.

57. The method of claim 55, further comprising:

receiving a read access memory request including a memory address; and reading data from the selected portion of the redundant memory if the memory address of the read access memory request matches the memory address mapped to the selected portion of the redundant memory.

58. The method of claim 55, further comprising:

identifying a weak bit of the TMUT that is susceptible to a spurious data error;

writing the memory address of the TMUT into a GBR as a global memory address;

writing a bit identifier of the weak bit into the GBR; and writing a correct bit value of the weak bit into the GBR so that the bit identifier of the weak bit and the correct bit value of the weak bit is associated with the global memory address.

59. The method of claim 58, further comprising:

receiving a read access memory request including a memory address;

accessing data from the main memory or redundant memory based on the memory address of the read access request; and updating a bit value of the accessed data with the correct bit value associated with the global memory address in the GBR if the memory address of the read access memory request matches the global memory address stored in the GBR.

60. The method of claim 58, further comprising:

receiving a write access memory request including a memory address;

writing data from the write access memory request to the main memory or redundant memory based on the memory address of the write access request; and updating the correct bit value associated with the global memory address in the GBR with a bit value of a corresponding data bit in the write memory request, if the memory address of the write access memory request matches the global memory address stored in the GBR.

61. The method of claim 55, wherein the selected portion of the main memory includes a check bit, the method further comprising:

detecting a single bit error in the data stored in the TMUT; and correcting the single data bit error in the data stored in the TMUT.

62. The method of claim 37 further comprising:

identifying a weak bit of the TMUT that is susceptible to a spurious data error;

writing the memory address of the weak bit from the TMUT into a GBR as a global memory address;

writing a bit identifier of the weak bit into the GBR; and writing a correct bit value of the weak bit into the GBR so that the bit identifier of the weak bit and the correct bit value of the weak bit is associated with the global memory address.

63. The method of claim 62, further comprising:

receiving a read access memory request including a memory address;

accessing data from the main memory or redundant memory based on the memory address of the read access request; and updating a bit value of the accessed data with the correct bit value associated with the global memory address in the GBR if the memory address of the read access memory request matches the global memory address stored in the GBR.

64. The method of claim 62, further comprising:

receiving a write access memory request including a memory address;

writing data from the write access memory request to the main memory or redundant memory based on the memory address of the write access request; and updating the correct bit value associated with the global memory address in the GBR with a bit value of a corresponding data bit in the write memory request if the memory address of the write access memory request matches the global memory address stored in the GBR.

65. The method of claim 62, wherein the selected portion of the main memory includes a check bit, the method further comprising:

detecting a single bit error in the data stored in the TMUT; and correcting the single data bit error in the data stored in the TMUT.

66. The method of claim 62 further comprising:

providing access to the temporary memory when an external access points to the TMUT; and providing access to the main memory when the external access points to an address in main memory other than the TMUT.

67. The method of claim 37, further comprising:

receiving a command from a host coupled to the IC to initiate the method of testing the memory of the integrated circuit device at the discretion of the host.

68. An integrated circuit device (IC) comprising:

a main memory comprising a plurality of memory cells;

a temporary memory;

means for self-testing that are configured to select a portion of the main memory as the target memory under test (TMUT), to cache data from the TMUT into the temporary memory, and to apply a test to the TMUT; and means for arbitrating access to the temporary memory when an external access points to the TMUT, and access to the main memory when the external access points to an address in main memory other than the TMUT.

69. The IC of claim 68, further comprising:
means for repairing the main memory during production testing.

70. The IC of claim 68, further comprising:
means for stress testing the TMUT.

71. The IC of claim 68, further comprising:
means for enhancing the temporary memory construction to be less susceptible to a single bit data error than the main memory construction.

72. The IC of claim 68, further comprising:
means for providing selectable performance levels to stress test the TMUT.

73. A multi-chip module (MCM) comprising:
a first integrated circuit chip comprising a main memory for storing data;
a second integrated circuit chip coupled to the first integrated circuit chip, the second integrated circuit chip comprising:
a background built-in self-test module (BBISTM) configured to select a portion of the main memory as the target memory under test (TMUT), to cache data from the TMUT into the temporary memory, and to apply a test to the TMUT.

74. The MCM of claim 73, wherein the second integrated circuit chip comprises:
a temporary memory coupled to the BBISTM.

75. The MCM of claim 73, wherein:
the BBISTM is operational simultaneously while the IC is operational for performing external accesses during field operation; and
the latency for access to the cached data in the temporary memory is less than or equal to the latency for access to the data contained in the main memory.

76. The MCM of claim 73, wherein the IC includes multiple integrated circuit die stacked in memory module.

* * * * *